(12) United States Patent
Nagatani

(10) Patent No.: US 7,883,783 B2
(45) Date of Patent: Feb. 8, 2011

(54) ELECTRODEPOSITED COPPER FOIL WITH CARRIER FOIL ON WHICH A RESIN LAYER FOR FORMING INSULATING LAYER IS FORMED, COPPER-CLAD LAMINATE, PRINTED WIRING BOARD, METHOD FOR MANUFACTURING MULTILAYER COPPER-CLAD LAMINATE, AND METHOD FOR MANUFACTURING PRINTED WIRING BOARD

(75) Inventor: Seiji Nagatani, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 644 days.

(21) Appl. No.: 10/593,152

(22) PCT Filed: Mar. 15, 2005

(86) PCT No.: PCT/JP2005/004501
§ 371 (c)(1),
(2), (4) Date: Sep. 18, 2006

(87) PCT Pub. No.: WO2005/087489
PCT Pub. Date: Sep. 22, 2005

(65) Prior Publication Data
US 2007/0207337 A1    Sep. 6, 2007

(30) Foreign Application Priority Data
Mar. 16, 2004    (JP)    ............................. 2004-075235

(51) Int. Cl.
*B32B 15/08*    (2006.01)

(52) U.S. Cl. ...................... 428/626; 428/606; 428/607; 428/674; 428/675; 428/901

(58) Field of Classification Search ...................... None
See application file for complete search history.

(56) References Cited

U.S. PATENT DOCUMENTS

| | | | | |
|---|---|---|---|---|
| 5,617,629 | A | * | 4/1997 | Ekstrom ...................... 29/846 |
| 6,346,335 | B1 | * | 2/2002 | Chen et al. ................... 428/629 |
| 6,551,433 | B2 | | 4/2003 | Kuwako et al. |
| 6,652,962 | B1 | | 11/2003 | Sato et al. |
| 6,766,817 | B2 | | 7/2004 | da Silva |
| 6,905,757 | B2 | * | 6/2005 | Matsushima et al. ........ 428/209 |
| 6,984,456 | B2 | | 1/2006 | Okada et al. |
| 7,026,059 | B2 | * | 4/2006 | Suzuki et al. ............... 428/626 |
| 7,175,920 | B2 | | 2/2007 | Suzuki et al. |

(Continued)

FOREIGN PATENT DOCUMENTS

JP    8-503174    4/1996

(Continued)

*Primary Examiner*—Aaron Austin
(74) *Attorney, Agent, or Firm*—Greenblum & Bernstein, P.L.C.

(57) ABSTRACT

An electrodeposited copper foil with carrier foil on which a resin layer for forming an insulating layer is formed, comprising a carrier foil, a bonding interface layer, an electrodeposited copper foil with smooth surfaces on both sides and a resin layer. The resin layer is composed of 20 to 80 parts by weight of an epoxy resin and a curing agent, 20 to 80 parts by weight of a solvent soluble aromatic polyamide resin polymer and optionally a curing accelerator in a suitable amount.

10 Claims, 13 Drawing Sheets

U.S. PATENT DOCUMENTS

2004/0038049 A1* 2/2004 Suzuki et al. .............. 428/457
2004/0241487 A1 12/2004 Nagatani

FOREIGN PATENT DOCUMENTS

| | | |
|---|---|---|
| JP | 9-18140 | 1/1997 |
| JP | 2000-43188 | 2/2000 |
| JP | 2002-33581 | 1/2002 |
| JP | 2003-292733 | 10/2003 |
| WO | 02/24444 | 3/2002 |
| WO | 03/096776 | 11/2003 |
| WO | 2004/005588 | 1/2004 |

* cited by examiner (4)

(5)

(f)

(g)

(h)

ELECTRODEPOSITED COPPER FOIL WITH CARRIER FOIL ON WHICH A RESIN LAYER FOR FORMING INSULATING LAYER IS FORMED, COPPER-CLAD LAMINATE, PRINTED WIRING BOARD, METHOD FOR MANUFACTURING MULTILAYER COPPER-CLAD LAMINATE, AND METHOD FOR MANUFACTURING PRINTED WIRING BOARD

CROSS REFERENCE TO RELATED APPLICATION

This application is a 35 USC §371 National Phase Entry Application from PCT/JP2005/004501, filed Mar. 15, 2005, and designating the United States.

TECHNICAL FIELD

The invention relates to an electrodeposited copper foil with carrier foil on which resin layer for forming an insulating layer is formed, a copper-clad laminate and a printed wiring board obtained by using an electrodeposited copper foil with carrier foil on which resin layer for forming an insulating layer is formed, and a manufacturing method of a multilayer printed wiring board using an electrodeposited copper foil with carrier foil on which resin layer for forming an insulating layer is formed.

BACKGROUND ART

Conventional copper foils having been used for manufacturing of printed wiring boards, as disclosed in many documents including Patent Document 1, are subjected to a roughening treatment to make one surface uneven by adhering fine copper particles or by other means. When it is laminated with a base resin such as a prepreg, the unevenness shape of roughened surface of the copper foil buried in the base resin works as anchor effect, whereby the good adhesion of the copper foil and the base resin is assured.

In the case of an electrodeposited copper foil as example, a bulk copper layer as a base body of an electrodeposited copper foil is obtained from procedures, a copper electrolyte solution supplied into the gap between a drum-shaped rotating cathode and a lead-based anode or the like which is facing with and disposed along the shape of the rotating cathode, deposited copper as a foil state on the drum surface of the rotating cathode by utilizing electrolytic reaction, and then continuously peel off the copper foil from the rotating cathode.

The one surface of the electrodeposited copper foil thus obtained is referred to as a shiny surface. Because the surface has been in contact with a rotating cathode so it has mirror shape of the mirror-finished rotating cathode surface, and is a glossy smooth surface. On the other hand, the surface shape on the solution side which has been a deposition side assumes an angular unevenness shape because crystal growth rates of copper deposition are different for every crystalline plane, so the surface is referred to as a matte surface. This matte surface is ordinarily used for a laminating surface with an insulation material when a copper-clad laminate is manufactured.

Then, this non-treated foil is subjected to a roughening treatment and a rustproof treatment on the matte surface in a surface treatment process. The roughening treatment on the matte surface means that a current condition of the so-called burning plating condition is applied in a copper sulfate solution, depositing fine copper particles on the angular unevenness shape of the matte surface, and immediately being subjected to a seal plating in a current condition for the level plating, and is to prevent dropping-off of the fine copper particles. Therefore, the matte surface on which fine copper particles have been deposited and adhered is referred to as "roughened surface". Then, an electrodeposited copper foil is finished by being subjected to a rustproof treatment, etc if required.

However, in recent years, with the tendency of light-weight and miniaturization of electronic devices for which printed wiring boards are applied, the demand for the wiring density of printed wiring boards has increased year by year. Moreover, the improvement in product quality has been requested; the precision on circuit shapes formed by etching has also been highly requested; and for etching factor of the circuit, a level where the impedance control can be completely performed has been requested.

Then, for solving such a problem in the circuit etching factor, as disclosed in Patent Document 2, an attempt to obtain a favorable adhesion after lamination, etc. even without the roughening treatment, for assurance of the adhesion with a base resin, two resin layers having different compositions are formed on the surface of a copper foil without roughening treatment. Moreover, to get the circuit shape after etching in a good shape, thinner copper foil layer to be etched has been desired. For responding to this requirement, as disclosed in Patent Document 3, the electrodeposited copper foil with carrier foil is supplied to the markets for a long time. Since in the electrodeposited copper foil with carrier foil, the carrier foil works as a supporter in the state of being bonded with the electrodeposited copper foil layer, it has advantages of thinning of the copper foil layer with ease, handling thereof with ease, no occurrence of wrinkles and no contamination of the copper foil surface.

Patent Document 1: Japanese Patent Laid-Open No. 05-029740

Patent Document 2: Japanese Patent Laid-Open No. 11-10794

Patent Document 3: Japanese Patent Laid-Open No. 2000-43188

However, as far as the present inventors know, it is found that even if a resin-coated copper foil disclosed in Patent Document 2 is used, the copper foil surface without roughening treatment does not provide a stable adhesion with a base resin. Additionally, since it is provided with two resin layers having different compositions, two or more coating processes are required for manufacturing of the resin layers, thus it increases the manufacturing cost.

On the other hand, if a copper foil without roughening treatment can be used for manufacture of a printed wiring board, the above-mentioned roughening treatment process of a copper foil can be eliminated. Consequently, it makes a large reduction of the production cost possible, and it also leads to surviving in the recent years' international cost competition in fact. Moreover, there is no roughening treatment of the copper foil, an over etching time for dissolving roughening-treated parts in circuit etching is not required to enable reduction of the total etching cost, so the etching factor of the obtained circuit may remarkably improved.

As shown above, it is clear that use of a copper foil without roughening treatment for a printed wiring board has been thought as an un-applicable technology in industry. But, if a copper foil without roughening treatment can be used for manufacture of a printed wiring board, the total manufacturing cost of the printed wiring board can be remarkably reduced. Further, if this problem can be solved with the electrodeposited copper foil, thinner the copper foil can be evident and it gives a great effect on markets.

DISCLOSURE OF THE INVENTION

As a result of extensive studies, the present inventors have thought of an electrodeposited copper foil with carrier foil on which resin layer for forming an insulating layer is coated of the present invention. Hereinafter, the description in detail of the present invention will be shown in items of "an electrodeposited copper foil with carrier foil on which resin layer for forming an insulating layer is coated", "a manufacturing method of a multilayer printed wiring board" and the like.

<An Electrodeposited Copper Foil with Carrier Foil on which Resin Layer for Forming an Insulating Layer is Formed>

An electrodeposited copper foil with carrier foil on which resin layer for forming an insulating layer is formed of the present invention (hereinafter, simply referred to as "a resin coated electrodeposited copper foil with carrier foil") is provided, as the basic constitution, bonding interface layer is formed on the carrier foil, electrodeposited copper foil which both side have smooth surface is formed on the bonding interface layer and resin layer is formed on the electrodeposited copper foil. FIG. 1 shows schematic sectional view of this electrodeposited copper foil with carrier foil 1a provided with a resin layer so that the layer constitution is understood.

It is required on both surfaces of the electrodeposited copper foil layer 2 to be smooth having no unevenness as possible, and on the resin composition employed for the resin layer; it is required to assure an enough adhesion even with a smooth copper foil surface. Hereinafter, each constitution element will be described one by one.

[Carrier Foil]

A material for a carrier foil 3 to be used is not especially limited. As for a carrier foil, it is used in a concept involving all materials usable for a carrier, such as aluminum foil, copper foil and a metal coated resin film. But, the material is usable as long as it is selectively used corresponding to the kind of a bonding interface layer. However, since an electrodeposited copper foil layer is formed by electrodeposition by electrically energizing a carrier foil, if the carrier foil is not conductive, the electrodeposited copper foil layer cannot be formed on it, so the carrier has to have a metal on its surface. The thickness of a carrier foil is not especially limited. In the concept of a foil from the industrial viewpoint, a web of not more than 200 μm in thickness is generally referred to as a foil, and the use of this concept serve.

Especially, use of an electrodeposited copper foil as the carrier foil 3 has an advantage. Electrodeposited copper foils are generally manufactured through an electrolytic process and a surface treatment process, and used as a base material for manufacturing printed wiring boards used in the fields of electric and electronic industries. An electrodeposited copper foil to be used as a carrier foil has preferably a thickness of 12 μm to 210 μm. The reason why the thickness of an electrodeposited copper foil to be used as a carrier foil is determined to be 12 μm to 210 μm is that: for working as a reinforcing material as a carrier foil to prevent occurrence of wrinkles on an ultra thin copper foil of not more than 9 μm, the thickness of a minimum of about 12 μm is necessary; and with the thickness exceeding a maximum of 210 μm, the carrier may be not a copper foil but a copper strip, and becomes difficult to wind into a roll state.

An aluminum material conventionally used as a carrier foil is obtained by the rolling method, so rolling oil inevitably covers on the foil. An oil component is also sometimes coated in consideration of the oxidation prevention. When these foils are used as a carrier foil, since the oils become an obstacle on depositing copper on the carrier, removal of the oil content in a process is required. If the carrier foil is an electrodeposited copper foil, oil content does not inevitably adhere, and even if an oxide layer is formed, it can easily be removed by pickling, allowing the reduction of the number of processes, the easy process management, and the easy recycling.

[Bonding Interface Layer]

A bonding interface layer 4 exists in the state of being interposed between the carrier foil 3 and an electrodeposited copper foil layer 2. The bonding interface layer is preferably of a peelable type by which the carrier foil can be removed by peeling. For forming such a bonding interface, an organic bonding interface is preferably formed using an organic agent as disclosed in Patent Document 3. This is because the peel strength of the carrier foil is at a low and stabilized level. An organic agent as mentioned herein is preferably used which is one or more kinds selected from a nitrogen-containing organic compound, a sulfur-containing organic compound and a carboxylic acid. They will be more specifically recited below.

Of a nitrogen-containing organic compound, a sulfur-containing organic compound and a carboxylic acid, a nitrogen-containing organic compound includes a nitrogen-containing organic compound having a substituent. Specifically, preferably used as a nitrogen-containing organic compound is a triazole compound having a substituent such as 1,2,3-benzotriazole (hereinafter, referred to as "BTA"), carboxybenzotriazole (hereinafter, referred to as "CBTA"), N',N'-bis(benzotriazolylmethyl)urea (hereinafter, referred to as "BTD-U"), 1H-1,2,4-triazole (hereinafter, referred to as "TA") or 3-amino-1H-1,2,4-triazole (hereinafter, referred to as "ATA").

Preferably used as a sulfur-containing organic compound is mercaptobenzothiazole (hereinafter, referred to as "MBT"), thiocyanuric acid (hereinafter, referred to as "TCA"), 2-benzoimidazolethiol (hereinafter, referred to as "BIT"), etc.

Preferably used as a carboxylic acid is especially a monocarboxylic acid, and preferably used among those is oleic acid, linoleic acid, linoleinic acid, etc.

Then, this bonding interface layer becomes a substantial electrodepositing surface of copper. Therefore, the thickness of the bonding interface layer is preferably in the range from 0.5 nm to 1 μm. The thickness range specified here assures suitable peel strength of the carrier foil after press lamination and moreover stably electrodepositing copper. That is, with the thickness of the bonding interface layer formed using an organic agent being below 0.5 nm of the lower limit, variations in the thickness of the bonding interface layer are generated; the carrier foil cannot uniformly be coated; a stable and reliable peel strength after press lamination cannot be obtained; and portions where the carrier foil cannot be peeled off is generated in some case. By contrast, with the thickness exceeding 1 μm of the upper limit, the energizing state when an electrodeposited copper foil layer is to be formed becomes unstable; the depositing situation of copper is unstable; and the formation of an electrodeposited copper foil layer with uniform thickness becomes difficult. With the bonding interface layer of a further large thickness, the enegization is completely disabled.

[Electrodeposited Copper Foil Layer]

The thickness of an electrodeposited copper foil layer 2 is not especially limited. However, the thickness of not more than 12 μm is desirably employed. With the thickness exceeding 12 μm, the purpose of making the handling of an ultra thin copper foil easy, which is an advantage of an electrodeposited copper foil with carrier foil, ends up in being ignored. For remarkably improve the etching factor of a circuit formed by etching an electrodeposited copper foil layer, the thickness of the electrodeposited copper foil layer is preferably not more than 5 μm, further preferably not more than 3 μm. It should be noted that, in the resin coated electrodeposited copper foil with carrier foil of the present invention, without roughening the laminating surface with a base resin as in a conventional electrodeposited copper foil, a sufficient adhesion with the base material is obtained, and the electrodeposited copper foil hardly peel off from the base material.

In the formation of an electrodeposited copper foil layer 2, the thickness is practically in the range from 0.5 μm to 12 μm. The reason of setting the upper limit of the thickness is as described above. And for making an electrodeposited copper foil layer having a uniform thickness, the electrodeposited copper foil layer has to have a thickness of not less than 0.5 μm; otherwise, it does not have the fundamental quality required in it due to occurrence of micro porosities and the like.

Both surfaces of an electrodeposited copper foil layer have preferably a surface roughness (Rz) of not more than 2 μm. If the thickness of an electrodeposited copper foil layer is not more than 7 μm even if a conventional solution for manufacturing an electrodeposited copper foil is used, the above surface roughness even on the matte surface can be naturally accomplished. By contrast, in the case of an electrodeposited copper foil layer having a thickness exceeding 7 μm, it is manufactured desirably by using an electrolyte solution used in manufacture of VLP foil, a very low profile copper foil specified in ANSI/IPC-MF-150F.

[Rustproofing Layer]

A rustproofing layer has especially no limitation to the kind of rustproofing. The rustproofing includes, for example, the inorganic rustproofing using zinc, brass, etc. and the organic rustproofing using an organic agent such as benzotriazole or imidazole. However, preferably, the rustproofing layer of the present invention basically employs a rustproofing layer of metal 7, a chromate treatment layer 8 or a combination thereof. Further, optionally, a silane coupling agent treatment layer later described is preferably provided. The rustproofing layer 7, although it does not contact directly with the air because a resin layer is present on its surface, is desirable from the viewpoint of assurance of the long-term shelf life of the resin coated electrodeposited copper foil with carrier foil of the present invention and the sureness of the quality maintenance of the electrodeposited copper foil layer.

Moreover, the rustproofing layer is also a bonding surface with a resin layer 5. Therefore, considering a favorable wettability and adhesion with the resin layer, a nickel-zinc alloy is preferably used as the rustproofing layer. Especially, the nickel-zinc alloy base rustproofing layer has preferably a composition containing 50 wt % to 99 wt % of nickel and 50 wt % to 1 wt % of zinc containing inevitable impurities.

In the resin coated electrodeposited copper foil with carrier foil of the present invention, it is found that the presence of nickel in the rustproofing layer shows a tendency of remarkable improvement in the adhesion with a constituting resin of the base material. The rustproofing layer formed of the nickel-zinc alloy, with the nickel content of less than 50 wt %, cannot be expected to have an improving effect on the adhesion with various kinds of base materials. Nickel content exceeding 99 wt % is not favorable, because the tendency of nickel remaining after etching is found. According to studies of the present inventors, in the resin coated electrodeposited copper foil with carrier foil of the present invention, when a rustproofing layer of nickel and zinc is formed, the total amount of nickel and zinc is desirably in the range from 20 mg/m$^2$ to 100 mg/m$^2$. Especially, when a rustproofing layer of the nickel-zinc alloy has been formed, with special base materials to which bond strength is otherwise hardly secured, the electrodeposited copper foil is not easily peeled off from the laminate interface, and the chemical resistance, moisture resistance and solder-blister resistance become excellent. With the total coating amount of less than 20 mg/m$^2$, a rustproofing layer of a uniform thickness cannot be obtained, resulting in a large deviation in the bond strength. By contrast, the total coating amount exceeding 100 mg/m$^2$ unfavorably cause the tendency of generating the etching residue of the nickel component in an etching time of the conductive circuit formation.

The result of studies of the present inventors has confirmed that a more nickel amount has a tendency of improving the adhesion strength, chemical resistance, moisture resistance and solder-blister resistance, and a more zinc amount has a tendency of deteriorating the chemical resistance and solder-blister resistance. Further, it is found that when the total coating amount of nickel and zinc is set to be in the range from 20 mg/m$^2$ to 100 mg/m$^2$ in the case of forming a rustproofing layer of a nickel-zinc alloy, the ratio of the nickel to the zinc (nickel/zinc) is set practically suitably to be in the range from 6/4 to 8/2. The nickel ratio exceeding 80% has a tendency of generating an etching residue in forming a circuit. The zinc ratio exceeding 40% has a tendency of deteriorating the chemical resistance and solder-blister resistance.

Further, in the resin coated electrodeposited copper foil with carrier foil of the present invention, the rustproofing layer is also preferably formed of a nickel-zinc alloy layer and a chromate layer. The presence of the chromate layer brings about a tendency of improving the corrosion resistance and the adhesion with a resin layer. For the formation of the chromate layer, either of the substitution method and electrolysis method may be employed according to the popular methods.

[Silane Coupling Agent Treatment Layer]

Further, between the electrodeposited copper foil layer and a resin layer, a silane coupling agent treatment layer is preferably provided. In the case of the resin coated electrodeposited copper foil with carrier foil of the present invention, a silane coupling agent treatment layer may be provided directly on a surface of an electrodeposited copper foil layer, and a resin layer may be provided on the silane coupling agent treatment layer. A silane coupling agent treatment layer improves the wettability of a resin with a copper foil surface which has not been subjected to the roughening treatment, and functions as an auxiliary agent to improve the adhesion when the copper foil is press-laminated onto a base resin. By the way, higher peel strength of circuits of printed wiring boards has so far been said to be better. However, in recent years, circuit wirings hardly drop off in etching process because handling of the materials in the etching process is improved.

Also the problem in which circuits drop off due to hooking of the circuits has diminished since the handling way of printed wiring boards in the printed wiring board industry has been established. Therefore, the peel strength over 0.8 kgf/cm is said to be acceptable in an actual usage now; and that of not less than 1.0 kgf/cm is enough. As for the silane coupling agent when lamination on a FR-4 prepreg is performed, various silane coupling agents including the most popular epoxy functional silane coupling agent, and an olefinic functional silane coupling agent and an acrylic functional silane coupling agent, peel strength measured show about 0.8 kgf/cm. However, if an especially preferable amino functional silane coupling agent or mercapto functional silane coupling agent is used, the peel strength shows not less than 1.0 kgf/cm.

Methods for forming a silane coupling agent treatment layer include the popularly used method such as the immersion method, showering method or spraying method, and are not especially limited. The method can optionally be employed which can make a copper foil contact most uniformly with a solution containing a silane coupling agent and adsorb it conforming to the process design.

The silane coupling agent recommended here will be more specifically described. Mainly used coupling agents are similar to those used for glass cloth treatment of pre-preg for printed wiring boards. For example, vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, γ-aminopropyltriethoxysilane, N-β(aminoethyl)γ-aminopropyltrimethoxysilane, N-3-(4-(3-aminopropoxy)butoxy)propyl-3-aminopropyltrimeth oxysilane, imidazolesilane, triazinesilane, γ-mercaptopropyltrimethoxysilane and the like, are recommended. In comparison with use of epoxy-functional silane coupling agents, use of amino-functional silane coupling agents and mercapto-functional silane coupling agents have a remarkable effect on improvement in the adhesion with a resin layer. Amino-functional silane coupling agents are more preferably suitable, and include γ-aminopropyltriethoxysilane, N-β(aminoethyl) γ-aminopropyltrimethoxysilane and N-3-(4-(3-aminopropoxy)butoxy)propyl-3-aminopropyltrimeth oxysilane.

These silane coupling agents are dissolved in water as the solvent in a concentration of 0.5 g/l to 10 g/l, and used at room temperature. Silane coupling agents form a film by condensation-bonding with OH-functional existing on the surface of a copper foil, and if a solution in excess concentration is applied, its effect does not outstandingly increase. Therefore, the concentration has to be determined according to the process operation speed, etc. But with less than 0.5 g/l, the adsorption rate of the silane coupling agent comes low, which is unprofitable in a general commercial basis, and the adsorption becomes uneven. Even with the concentration exceeding 10 g/l, the adsorption rate does not especially goes up, just poor in economy.

However, in the case of the resin coated electrodeposited copper foil with carrier foil of the present invention, it is preferred to make the surface of the rustproofing layer with a silane coupling agent treatment layer from the viewpoint of improving the adhesion with a resin layer. It is especially preferred to provide the surface of the rustproofing layer formed of the nickel-zinc alloy with a silane coupling agent treatment layer, or providing the surface of the rustproofing layer formed of the nickel-zinc alloy and the chromate layer with a silane coupling agent treatment layer. Especially, the chromate layer and silane coupling agent treatment layer improves the adhesion with an insulating layer, and can achieve improvement in the moisture resistance and chemical resistance.

As shown above, the resin coated electrodeposited copper foil with carrier foil of the present invention involves an embodiment shown in FIG. 1 and additionally embodiments are shown in FIGS. 2 to 6. Here, although schematic cross-sectional views in the drawings used in the description of the present invention describe a rustproofing layer of metal 7, a chromate layer 8, a silane coupling agent treatment layer 6, etc. very desirably, these layers in a complete layer-shape cannot be identified for actual products even using a transmission electron microscope, so the drawings on cross-sections are for easier understanding of the description.

[Resin Layer]

(In the Case that Resin Layer was Formed by Just the Resin Composition)

Now, a resin composition constituting a resin layer 5 will be described. Hereinafter, of recommended resin compositions, resin compositions considered to be most excellent in the quality stability will be recited.

Resin composition 1: Simply describing, this resin composition is composed of an epoxy resin, a curing agent, a solvent-soluble aromatic polyamide resin polymer, and a curing accelerator added in a suitable amount if required. A composition described below shows the most favorable adhesion of a copper foil with a base resin.

"An epoxy resin" as it mentioned herein is a resin having two or more epoxy-functional in its molecule can be used without any problem as long as it is usable as a base materials for applications to electric and electronic industries. One kind selected from the group consisting of a bisphenol-A epoxy resin, bisphenol-F epoxy resin, bisphenol-S epoxy resin, novolac epoxy resin, cresol novolac epoxy resin, alicyclic epoxy resin, bromated epoxy resin and glycidylamine epoxy resin, or a mixture of at least two kinds thereof are preferably used.

This epoxy resin constitutes as the main part of the resin composition, and is used in a blending ratio of 20 parts by weight to 80 parts by weight. Here, the formulation involves a curing agent described below. Therefore, in the case of the epoxy resin of less than 20 parts by weight with a curing agent, it does not sufficiently exhibit the thermosetting property, and does not sufficiently accomplish the function as a binder to bond a base resin with a copper foil; and in the case exceeding 80 parts by weight, the viscosity of a resin varnish becomes too high to lead a difficulty in coating the varnish on a copper foil surface in a uniform thickness. And a sufficient toughness after curing cannot be obtained because the epoxy resin cannot balance with the adding amount of an aromatic polyamide resin polymer as described later.

Then, "a curing agent" of the epoxy resin is amines such as dicyandiamide, imidazoles and aromatic amines, phenols such as bisphenol-A and bromated bisphenol-A, novolacs such as a phenol novolac resin and cresol novolac resin, and acid an hydride such as phthalic anhydride. Since the adding amount of a curing agent to an epoxy resin can be calculated from its equivalent weight, strictly describing the formulation ratio is considered to be unnecessary. Therefore, in the present invention, the adding amount of a curing agent is not especially limited.

Next, "an aromatic polyamide resin polymer" is one obtained from reaction of an aromatic polyamide resin with a rubbery resin. Here, the aromatic polyamide resin is one synthesized by condensation-polymerizing reaction of an aromatic diamine with a dicarboxylic acid. As the aromatic diamine used is 4,4'-diaminodiphenylmethane, 3,3'-diaminodiphenylsulfone, m-xylenediamine, 3,3'-oxydianiline, etc. As the dicarboxylic acid used is phthalic acid, isophthalic acid, terephthalic acid, fumaric acid, etc.

The rubbery resin made to react with the aromatic polyamide resin is described as a concept containing natural rubbers and synthetic rubbers. The synthetic rubbers include a styrene-butadiene rubber, butadiene rubber, butyl rubber and ethylene-propylene rubber. Further, for ensuring the heat resistance of a dielectric layer to be formed, selection of a synthetic rubber having the heat resistance, such as a nitrile rubber, chloroprene rubber, silicone rubber or urethane rubber, is recommended. These rubbery resins desirably have various functional groups at both terminals for manufacturing a copolymer from reaction of them with an aromatic polyamide resin. Especially, use of CTBN (carboxyl group-terminated butadiene nitrile) is recommended.

An aromatic polyamide resin and a rubbery resin to constitute an aromatic polyamide resin polymer are preferably used in a formulation of the aromatic polyamide resin of 25 wt % to 75 wt % and the rubbery resin of the balance. With the aromatic polyamide resin of less than 25 wt %, the presence ratio of the rubbery component becomes too large, resulting in the polymer being inferior in the heat resistance. By contrast, with that exceeding 75 wt %, the presence ratio of the aromatic polyamide resin becomes too large, resulting in the polymer having a too high hardness after curing and becoming brittle. This aromatic polyamide resin polymer is used for the purpose for preventing damage in etching process by an etching solution when a copper foil after processed into a copper-clad laminate is subjected to the etching process.

For the aromatic polyamide resin polymer, it is first required to have a property of being soluble in a solvent. The aromatic polyamide resin polymer is used in a formulation ratio of 20 wt % to 80 wt %. In the case of the aromatic polyamide resin polymer of less than 20 wt %, it cures too much and becomes brittle in a popular press condition when copper-clad laminates are manufactured; it tends to generate micro cracks on a board surface. On the other hand, adding the aromatic polyamide resin polymer exceeding 80 wt % does not cause any trouble, but even if the aromatic polyamide resin polymer is added in excess of 80 wt %, the strength after curing is not more improved. Therefore, in consideration of economy, 80 wt % can be said to be the upper limit.

"A curing accelerator added in a suitable amount if required" is a tertiary amine, imidazole, a urea-based curing accelerator, etc. In the present invention, the formulation ratio of the curing accelerator is not especially limited. This is because the adding amount of a curing accelerator, taking into consideration of production conditions, etc. in the process of manufacturing copper-clad laminates, so manufacturers are allowed to select addition in free.

As a solvent for use, dimethylformamide, dimethylacetamide, N-methylpyrrolidone, etc. are recommended. However, using a mixed solvent of methyl ethyl ketone and cyclopentanone for dissolving is most preferable at present in view of the environmental aspect. The mixing ratio when the mixed solvent is used is not especially limited. But, cyclopentanone may possibly inevitably comes into as a result of its use in an adjustment varnish of an aromatic polyamide resin polymer or otherwise. So, methyl ethyl ketone is recommended to be its co-solvent in consideration of the applications to printed wiring boards, because of rate of the evaporation and purge of the solvent in the heating process with consideration of the inevitable coming into of cyclopentanone.

A resin varnish is preferably made to be of a resin content of 25 wt % to 40 wt % using the solvent described above. The range of the resin content indicated here is one in which when the resin varnish is applied on the surface of a copper foil, the film thickness is made in the highest precision. With the resin content of less than 25 wt %, the viscosity is too low, resulting in a difficulty in ensuring the film thickness uniformity due to the flowing just after being applied on the copper foil surface. By contrast, with the resin content exceeding 40 wt %, the viscosity becomes high, it cause a difficulty in forming a thin film on the copper foil surface.

Resin composition 2: The resin composition 2 is one in which three kinds of epoxy resins, a bisphenol-A epoxy resin, a cresol novolac epoxy resin and a bromated bisphenol-A epoxy resin, are dissolved in a solvent. Then a reaction catalyst such as a curing agent, micro-milled silica and antimony trioxide are added to the varnish. The curing agent is same as in the resin composition 1. This resin composition 2 also exhibits a favorable adhesion of a copper foil with a base resin as in the resin composition 1.

Resin composition 3: The resin composition 3 is a polyphenylene ether-cyanate-based resin composition in which a polyphenylene ether resin, 2,2-bis(4-cyanatophenyl)propane, a phosphorus-containing phenol compound, manganese naphthenate and 2,2-bis(4-glycidylphenyl)propane are dissolved in a solvent. This resin composition 3 also exhibits a favorable adhesion of a copper foil with a base resin as in the resin composition 1.

Resin composition 4: The resin composition 4 is a siloxane-modified polyamideimide-based resin composition in which a siloxane-modified polyamideimide resin and a cresol novolac epoxy resin are dissolved in a solvent. This resin composition also exhibits a favorable adhesion of a copper foil with a base resin as in the resin composition 1.

(In the Case that Resin Layer Contains Dielectric Filler)

In the case of making the dielectric filler contained in any one of the above-mentioned resin compositions, it is used for forming capacitor layers, and filler can increase the electric capacity of capacitor circuits. For the dielectric filler, a dielectric powder of an oxide complex having the pevroskite structure, such as $BaTiO_3$, $SrTiO_3$, $Pb(Zr-Ti)O_3$ (popular name: PZT), $PbLaTiO_3$—$PbLaZrO$ (popular name: PLZT) and $SrBi_2Ta_2O_9$, (popular name: SBT) is used.

The powder property first required on the dielectric filler is to have a particle size in the range from 0.1 μm to 1.0 μm. The particle size as it mentioned herein is not one obtained by the indirect measurement like the presumption of an average particle size from a measurement such as the laser diffraction scattering particle size distribution measuring method or B.E.T. method. Because the measurement methods are inferior in precision since powder particles form a certain secondary aggregation state. So, average particle size is obtained by directly observing the dielectric filler by a scanning electron microscope (SEM) and analyzing the SEM images. In the present specification, this particle size is expressed as $D_{IA}$. In the image analysis on the dielectric filler powder observed using a scanning electron microscope (SEM) in the present specification to determine the average particle size $D_{IA}$, the round particle analysis is conducted with a roundness threshold value of 10 and an overlapping degree of 20 using IP-1000PC manufactured by Asahi Engineering Co., Ltd . . . .

Further, the volume cumulative particle size $D_{50}$ by the laser diffraction scattering particle size distribution measuring method is required to be 0.2 μm to 2.0 μm. And the dielectric powder is required to have the perovskite structure having a nearly spherical shape. And an aggregation ratio, expressed by $D_{50}/D_{IA}$ calculated from the volume cumulative particle size $D_{50}$ and the average particle size $D_{IA}$ obtained by the image analysis, is required to be not more than 4.5.

The volume cumulative particle size $D_{50}$ by the laser diffraction scattering particle size distribution measuring method means a particle size at a volume commutation of 50% obtained using the laser diffraction scattering particle size distribution measuring method; and a smaller value of the volume cumulative particle size $D_{50}$ means a larger ratio accounted for by fine powder particles in a particle size distribution of the dielectric filler powder. In the present invention, this value is required to be 0.2 µm to 2.0 µm. Namely, with the value of the volume cumulative particle size $D_{50}$ of less than 0.2 µm, even any dielectric filler powder employing any manufacturing method has a remarkably progressed aggregation, resulting in not satisfying the aggregation degree described below. By contrast, with the value of the volume cumulative particle size $D_{50}$ exceeding 2.0 µm, it cannot be used as the dielectric filler for forming embedded capacitor layers of printed wiring boards, which is an object of the present invention. Because, a dielectric layer of a double-sided copper-clad laminate used for forming an embedded capacitor layer popularly has a thickness of 10 µm to 25 µm, which requires the upper limit to be 2.0 µm for uniformly dispersing the dielectric filler.

The measurement of the volume cumulative particle size $D_{50}$ in the present invention is conducted by mixing and dispersing a dielectric filler powder in methyl ethyl ketone and charging the solution in a circulator of a laser diffraction scattering particle size distribution measuring instrument, Micro Trac HRA 9320-X100 (manufactured by Nikkiso Co., Ltd.).

The concept of aggregation ratio is used here is employed for the reason shown below. Specifically, the value of the volume cumulative particle size $D_{50}$ obtained using the laser diffraction scattering particle size distribution measuring method is considered not to be one obtained by directly observing the diameter of truly one by one particle of powder particles. Because almost all powder particles constituting a dielectric powder are not a mono-dispersed powder, but they are in an aggregation state of a plurality of powder particles being aggregating. In the situation, the laser diffraction scattering particle size distribution measuring method can be said to grasp an aggregating powder particle as one particle (aggregating particle) and calculate the volume cumulative particle size.

By contrast, since the average particle size $D_{IA}$ obtained by image-processing observation images of a dielectric powder observed using a SEM is one directly obtained from SEM observation images, primary particles are securely grasped, and on the other hand, it does not reflect the presence of the aggregation state of powder particles at all.

Considering as above, the present inventors have decided to grasp, as an aggregation degree, a value calculated by $D_{50}/D_{IA}$ using a volume cumulative particle size $D_{50}$ of the laser diffraction scattering particle size distribution measuring method and an average particle size $D_{IA}$ obtained by the image analysis. That is, the $D_{50}$ value reflecting the presence of the aggregation state on a measurement value is considered, on the assumption that values of $D_{50}$ and $D_{IA}$ can be measured in the same precision for the dielectric filler powder of the same lot and on the above-mentioned theory, to be larger than the $D_{IA}$ value.

If the aggregation state of the dielectric filler powder particles is not present at all, $D_{50}$ value may approaches to a $D_{IA}$ closely, and a value of $D_{50}/D_{IA}$ of the aggregation degree approaches 1. In the stage of the aggregation degree being 1, the powder can be said to be a mono-dispersed powder, in which the aggregation state of powder particles is not present at all. However, actually, the aggregation degree sometimes stands at a value of less than 1. In the case of the particle being a true sphere, the aggregation degree theoretically does not stand at a value of less than 1, but since powder particles are not actually a true sphere, the aggregation degree is supposed to stand at a value of less than 1.

In the present invention, the aggregation degree of the dielectric filler powder is preferably not more than 4.5. With the aggregation degree exceeding 4.5, the aggregation level of powder particles of the dielectric filler becomes too high, resulting in a difficulty in uniformly mixing with the above-mentioned resin composition.

Employing any manufacturing methods such as the alkoxide method, hydrothermal synthesis method or oxalate method, as a manufacturing method of the dielectric filler powder, inevitably forms a certain aggregation state, so the dielectric filler powder not satisfying the above-mentioned aggregation degree can be produced. Especially in the case of the hydrothermal method as a wet-processing method, formation of the aggregation state has a tendency of being liable to occur. Then, subjecting the powder in the aggregation state to the disaggregation treatment to separate into single particles allows the aggregation state of the dielectric filler powder to be in the range of the above-mentioned aggregation degree.

If only disaggregating operation is a purpose, various machines are recommended such as a high-energy ball mill, high-speed conductor collision type air flow crusher, impact type crusher, gauge mill, medium stirring mill, high-hydraulic crusher as disaggregation means. However, for ensuring the mix-ability and dispersion-ability of the dielectric filler powder and a resin composition, reduction of the viscosity of the dielectric filler containing resin varnish described below should be considered. For achieving the reduction of the viscosity of the dielectric filler containing resin varnish, the powder particles of the dielectric filler are required to have a small specific surface are a and a smooth surface. Therefore, the disaggregation means has not to be one which can disaggregate particles, but imparts damage to the surface of the powder particles and increases the specific surface are a at the time of disaggregation.

Based on such an understanding, as a result of extensive studies, the present inventors have found that two means are effective. Common to the two means is that the methods suppress to the minimize the contact of powder particles of the dielectric filler with parts of the inner wall, agitation blades, crushing medium, etc. of an apparatus, and make aggregated powder particles mutually collide to fully enable the disaggregation. That is, contact with parts of the inner wall, agitation blades, crushing medium, etc. of an apparatus leads to making the powder particle surface scratched, increasing the surface roughness, and deteriorating the sphericity, so use the methods preventing them. Then, the means in which making powder particles fully collide aggregate the powder particles in the aggregation state, and can simultaneously smooth the powder particle surface, can be employed.

One means subjects the dielectric filler powder in the aggregation state to the disaggregation treatment by utilizing a jet mill. "A jet mill" as mentioned herein performs the disaggregation operation by using a high-speed air flow, charging the dielectric filler powder therein and making the powder particles mutually collide therein.

The other means performs the disaggregation treatment is using a fluid mill utilizing the centrifugal force to the slurry in which the dielectric filler powder in the aggregation state is dispersed in a solvent not to destroy the stoichiometry. By using "a fluid mill utilizing the centrifugal force" as mentioned herein, the slurry is made to flow in a high speed so as to depict a circumferential orbit, and the aggregated particles are made to mutually collide in the solvent by the generated centrifugal force, thus perform the disaggregating operation. In such a manner, the slurry after completion of the disaggregating operation is rinsed, filtered and dried to obtain the dielectric filler powder after completion of the disaggregating operation. By the above-mentioned methods, the control of the aggregation degree and the smoothening of the powder surface of the dielectric filler powder are achieved.

The resin composition and the dielectric filler as described above are mixed to make the dielectric filler containing resin composition for forming embedded capacitor layers of printed wiring boards. The formulation ratio of the resin composition and the dielectric filler has desirably the dielectric filler content of 75 wt % to 85 wt % and a resin composition of the balance.

With the dielectric filler content of less than 75 wt %, the relative permittivity of 20 required in the market at present is not satisfied. The dielectric filler content exceeding 85 wt % means the resin composition content of less than 15 wt %, and the adhesion of the dielectric filler containing resin with a copper foil to be laminated thereon is poor, and cause a difficulty in manufacturing copper-clad laminates satisfying required properties for manufacturing printed wiring boards.

As for the dielectric filler to be preferably used, in consideration of the manufacturing precision for a powder at present, barium titanate, of oxides composite having the pevroskite structure. For the dielectric filler, either of a calcined barium titanate and non-calcined barium titanate is recommended. Use of a calcined barium titanate is preferably used for obtaining a high permittivity, but selective use is allowed depending on the designated quality of printed wiring board products.

In addition, the dielectric filler of barium titanate has most preferably a crystalline structure of cubic system. The cubic system and the tetragonal system exist in the crystalline structure of barium titanate, but use of the dielectric filler of barium titanate having the cubic structure provides a stabilized value of permittivity of a dielectric layer finally obtained in comparison with use of the dielectric filler of barium titanate having the tetragonal structure only. Therefore, use of at least a barium titanate powder having both crystalline structures of cubic system and tetragonal system is said to be required.

(In the Case of Forming a Resin Layer Containing Skeletal Material)

A skeletal material 10 as mentioned herein will first be described. As the resin used is any one of the above-mentioned resin compositions. In recent years, the laser ablation process has been much used for forming small-diameter via holes. Conventionally, a skeletal material of non-woven paper type has been considered to be excellent in laser processability, but recently, also a skeletal material of woven cloth type excellent in laser ablation processability has been developed. Specifically, even though woven cloth has conventionally be said to be inferior in the processability in comparison with non-woven papers, a SP cloth which is a woven cloth but it has the same laser ablation processability as that of non-woven papers by processing uniformly opening the woven cloth in the planar direction and flattening the sectional shape of warp and weft strands of the woven cloth. In such a situation, it comes clear that using a woven cloth which is superior in mechanical strengths such as crack resistance in comparison with non-woven papers has advantage. Therefore, if a woven cloth is applied to an insulating layer of the resin coated electrodeposited copper foil with carrier foil of the present invention, as described below, also the mechanical strength of the resin layer of the resin coated electrodeposited copper foil with carrier foil of the present invention will be remarkably improved.

A non-woven paper or a woven cloth 10 to be used here is desirably one using a glass fiber or aramid fiber. Because either has long experience in the application to printed wiring boards and is a highly reliable material. However, the material of a non-woven paper or woven cloth is not especially limited, but can be any material as long as it is usable for the application to printed wiring boards and has sufficient mechanical properties. A fiber constituting a non-woven paper and a woven cloth to be used here are preferably subjected to the silane coupling agent treatment for improving the wettability with a resin on their surface. The silane coupling agent can be one such as an amino- or epoxy-silane coupling agent depending on the purpose.

A resin layer containing skeletal material of the resin coated electrodeposited copper foil with carrier foil of the present invention is required to be directly formed on an electrodeposited copper foil layer of the electrodeposited copper foil with carrier foil. And the resin composition constituting the resin layer containing skeletal material is required to be in a semi-cured state. But laminating of an electrodeposited copper foil with carrier foil of the present invention with a conventional pre-preg by employing the hot-press lamination method is very difficult because of progress of curing in the resin layer. So, two methods as described below are preferably employed.

Method 1 to form a resin layer containing a skeletal material: A semi-cured first thermosetting resin layer is provided on the surface of an electrodeposited copper foil layer of the resin coated electrodeposited copper foil with carrier foil of the present invention. Then a non-woven paper or a woven cloth as a skeletal material is press-bonded to the first thermosetting resin layer and a second thermosetting resin layer is formed on the surface of the press-bonded non-woven paper or woven cloth. After that, it is dried to a semi-cured state and a semi-cured resin layer containing a non-woven paper or woven cloth is thus formed on one surface of the electrodeposited copper foil layer. Here, the formation of the resin layer will be shown represented by the case of using an electrodeposited copper foil with carrier foil 30a.

This manufacturing method will be described following processes flow shown in FIG. 7. First, a semi-cured first thermosetting resin layer 9 is formed on one surface of an electrodeposited copper foil with carrier foil 30a shown in FIG. 7 (1). An advantage of using an electrodeposited copper foil with carrier foil here lies in preventing contamination and damage on the surface of the electrodeposited copper foil layer in the forming process of the resin layer.

As a resin constituting the first thermosetting resin layer 9, an epoxy resin is generally used. Because it is widely used in the applications of printed wiring boards. Therefore, a resin constituting the first thermosetting resin layer is not especially limited as long as it is a thermosetting resin and is usable for printed wiring boards in the field of electric and electronic materials. The first thermosetting resin layer 9 is formed on the surface of an electrodeposited copper foil layer by applying a resin varnish with a solvent on the surface of an electrodeposited copper foil layer, or by laminating a resin film in a semi-cured state thereon, or otherwise. In the case of making a resin varnish using a solvent, for example, an epoxy resin, a curing agent and a curing accelerator are blended, and adjust the viscosity by using a solvent such as methyl ethyl ketone.

Then, the first thermosetting resin layer 9 formed on the surface of an electrodeposited copper foil layer has to be maintained in a semi-cured state. Because a non-woven paper or woven cloth 10 described below should be press-bonded well, and the resin impregnation of a certain amount into the non-woven paper or woven cloth should be promoted. Therefore, when a resin varnish is applied on the surface of an electrodeposited copper foil 2, and thereafter it is made to be a semi-cured state with adjusting the drying level and curing degree by using a hot air drier, etc.

The thickness of the first thermosetting resin layer 9 formed on the surface of the electrodeposited copper foil layer 2 is determined in consideration of the thickness of a non-woven paper or woven cloth 10 described below. Specifically, the thickness of the first thermosetting resin layer 9 has to be not more than that of the non-woven paper or woven cloth 10. If the thickness of the first thermosetting resin layer 9 is not less than that of the non-woven paper or woven cloth 10, the resin constituting the first thermosetting resin layer 9 causes the lateral flow when the non-woven paper or woven cloth 10 is press-bonded. It may results contaminating of the apparatus. If press rolls for lamination 11 are contaminated, the contamination may transfer to the surface of the electrodeposited copper foil layer 2 to be processed, resulting in causing the product faulty. On the other hand, the minimum thickness of the first thermosetting resin layer 9 has to be one which uniformly cover the electrodeposited copper foil layer preventing the direct contact of the electrodeposited copper foil layer with the non-woven paper or woven cloth 10.

The first thermosetting resin layer 9 is formed on the surface of the electrodeposited copper foil layer 2 as described above, and then the non-woven paper or woven cloth 10 is attached on the first thermosetting resin layer 9 using press rolls for lamination 11 shown in FIG. 7 (3). The non-woven paper or woven cloth 10 is to be skeletal material, and is used for solving poor mechanical strengths of conventional resin coated copper foils. The non-woven paper or woven cloth 10 is attached on the first thermosetting resin layer 9 using the press rolls for laminations while applying a certain load. When the non-woven paper or woven cloth 10 is attached on a first thermosetting resin 3 in a semi-cured state, it has to be attached by using press rolls for lamination equipped with a heating means, heating the rolls themselves and applying a pressure of a certain level or more. This is for re-fluidizing the resin in a semi-cured state and impregnating a certain amount of the re-fluidized resin into the non-woven paper or woven cloth.

The thickness of the non-woven paper or woven cloth 10 is not especially limited, but a thin non-woven paper or woven cloth of not more than 50 μm in thickness, which cannot conventionally be used, becomes applicable. In the conventional method in which a non-woven paper or woven cloth is immersed into a resin varnish, impregnated with the resin varnish, and pulled up and dried into a semi-cured state to make a pre-preg. In such a case, the thin non-woven paper of not more than 50 μm in thickness or the woven cloth of not more than 20 μm in thickness used may cause faulty of immediate rupture and damage due to the insufficient mechanical strengths. Even if rupture and damage are not caused, the prepreg is elongated by a tension for machine direction, and consequently a large difference in the expansion and contraction rates between the machine direction and transverse direction is generated. And which used may cause a great defect in the dimensional stability which is very important in so-called precise printed wiring boards.

However, if a forming method of a resin layer as mentioned herein is employed, even use of a thin non-woven paper of not more than 50 μm in thickness or a woven cloth of not more than 20 μm in thickness does not cause the rupture and damage. Considering the manufacturing technology level of non-woven papers and woven cloths at present, the lower limit of the thickness of non-woven papers or woven cloths which can be supplied having sufficiently guaranteed qualities are said to be 45 μm or 20 μm, respectively. The manufacture of further thinner non-woven papers and woven cloths becomes conceivably possible in the future; but even in the case where a heavy article such as a fly back transformer for a TV set is directly mounted on a printed wiring board, if the bending strength as an insulating resin board described in embodiments is 200 MPa, it is said to sufficiently withstand the usage; therefore, the thickness of a non-woven paper or woven cloth is considered to be well used suitably and selectively so as to exceed the strength required.

After the completion of attaching of the non-woven paper or woven cloth as described above, a resin is applied on the non-woven paper or woven cloth as shown in FIG. 2 (4) to form a second thermosetting resin layer 12, and dried. As the resin, an epoxy resin is popularly used as in the first thermosetting resin layer 9. The resin constituting the second thermosetting resin layer 12 is not especially limited as in the first thermosetting resin layer 9 as long as it is a thermosetting resin and used for printed wiring boards in the field of electric and electronic materials. For a forming method of the second thermosetting resin layer 12, the forming method of the first thermosetting resin layer 9 can be similarly applied. The second thermosetting resin layer 12 has to be maintained in a semi-cured state. Because it may be laminated with another printed wiring board material, and press-laminated to be used as a constituting material of a printed wiring board. The thickness of the second thermosetting resin layer 12 as well, in the consideration similar to for the first thermosetting resin layer 9, has to completely coat the non-woven paper or woven cloth and have a certain thickness to prevent the contact with a copper foil or circuits to be laminated with. As above, the resin coated electrodeposited copper foil with carrier foil of the present invention is obtained.

Method 2 to form a resin layer containing a skeletal material: Another method for obtaining a product similar to the resin coated electrodeposited copper foil with carrier foil obtained by the manufacturing method as described above, involves providing a thermosetting resin varnish layer on the surface of an electrodeposited copper foil layer, laying a non-woven paper or woven cloth to be a skeletal material on the thermosetting resin layer, impregnating the thermosetting resin into the non-woven paper or woven cloth and making it penetrate to the opposite side to fully coat the non-woven paper or woven cloth with the thermosetting resin, and drying to be a semi-cured state to form a semi-cured insulating layer containing a non-woven paper or woven cloth on one surface of an electrodeposited copper foil layer.

The manufacturing method is characterized in a process flow conceptually shown in FIG. 8 to FIG. 9. On one surface of an electrodeposited copper foil layer 2 shown in FIG. 8 (1), a thermosetting resin layer 9' is provided as shown in FIG. 8 (2); and a non-woven paper or woven cloth 10 is laid on the surface of the thermosetting resin layer 9' as shown in FIG. 8 (3). Then, it is heated by a heater 14 in a heating furnace 13 as shown in FIG. 9 (4); the resin composition of the thermosetting resin layer 9' is thereby fluidized to impregnate utilizing the capillary phenomenon into glass fibers or aramid fibers constituting the non-woven paper or woven cloth 10, and further made to penetrate to the opposite side to the contact surface with the thermosetting resin layer 9' of the non-woven paper or woven cloth 10 to fully coat the surface of non-woven paper or woven cloth 10, thus obtaining a resin coated electrodeposited copper foil with carrier foil as shown in FIG. 9 (5).

In the process shown in FIG. 8 (3), the non-woven paper or woven cloth 10 is impregnated and coated with a resin preferably taking the following points into consideration. Namely, since a thermosetting resin layer 9' as varnish is formed by the coating process on the surface of the copper foil, and generally contains a solvent in a large amount, if the non-woven paper or woven cloth 10 is laid on the resin layer surface without purging the solvent at all, and is subjected to the next process, bubbles are liable to be generated and included in the thermosetting resin layer 9' between the electrodeposited copper foil layer 2 and the non-woven paper or woven cloth 10 when the thermosetting resin layer 9' is finally converted to a semi-cured state. Therefore, before the non-woven paper or woven cloth 10 is laid on the surface of the thermosetting resin layer 9', the solvent is preferably purged in a certain amount to prevent generation of the bubble. The purge of the solvent may be simply by air-drying or heating at temperatures not higher than the curing temperature. The purge level of the solvent can optionally be controlled so as not to generate the bubbles in consideration of the thickness of the thermosetting resin layer 9' and the thickness of the non-woven paper or woven cloth 10.

When the solvent is tried to be purged from the resin component of the thermosetting resin varnish layer 9' before then on-woven paper or woven cloth 10 is laid, the thermosetting resin varnish layer is sometimes converted to a semi-cured state. In such a case, by re-fluidizing the resin of the semi-cured thermosetting resin layer 9', the resin has to be made to impregnate utilizing the capillary phenomenon into glass fibers or aramid fibers constituting the non-woven paper or woven cloth 10, and further made to penetrate to the opposite side to the contact surface with the thermosetting resin layer 9' of the non-woven paper or woven cloth 10. Therefore, in such a case, the thermosetting resin layer 9' is required to be re-fluidized by heating at a temperature of not more than the curing temperature. The thickness of the thermosetting resin layer 9' as mentioned in this method is determined in consideration of the impregnating amount of the resin composition into the skeletal material, etc. As described above, by performing the resin impregnation and cooling to room temperature, the electrodeposited copper foil with carrier foil provided with a resin of the present invention is obtained.

<A Multilayer Printed Wiring Board>

[A Manufacturing Method of a Multiplayer Copper-Clad Laminate]

A manufacturing method of a multilayer printed wiring board using an electrodeposited copper foil with carrier foil on which resin layer for forming an insulating layer is coated of the present invention is characterized by comprising the following steps A to F. Hereinafter, every step will be described one by one.

(Step A)

Step A is an ablation process to form through holes or via holes in a double-sided copper-clad laminate for inner layer, and optionally followed by a residue removal treatment such as desmearing treatment using an oxidizing agent such as permanganate, a chromate salt or chromic acid. Here, the double-sided copper-clad laminate for inner layer is used for manufacturing inner layer circuit boards generally referred to as inner layer core materials or shield plates. And it is described as a concept all of copper-clad laminate containing any one of multilayer copper clad laminate with three or more layers and a double-sided copper-clad laminate.

In Step A, a double-sided copper-clad laminate 20 shown in FIG. 10 (a) is used. For the double-sided copper clad laminate, one in which conventional copper foils are laminated on both surfaces of a conventional base material such as FR-4 or one in which the electrodeposited copper foil with carrier foils provided with a resin layer of the present invention are laminated on both surfaces of a base material can be used after the carrier foils are removed. Thus, the kind of a double-sided copper-clad laminate is not especially limited.

Then, as shown in FIG. 10 (b), a mechanical drilling or laser drilling is performed on the copper-clad laminate 20 as an ablation process to form through holes or via holes, optionally followed by a residue removal treatment such as desmearing treatment. Both the copper foil layers are copper foil layers 21 for forming inner layer circuits.

In Step B, as shown in FIG. 10 (c), treatment for thin copper plating is performed on the inner wall of the ablated through hole or via hole portion to perform an interlayer connection. The treatment is one generally referred to as through hole plating or via hole plating, and involves making a catalyst adsorbed using a noble metal ion like a palladium colloid according to the popular method, and plate a thin copper layer 22 (depicted simply with dashed lines in the drawing) on the inner wall of the ablated holes by the electroless copper plating. Although in a conventional manufacturing method, an electrolytic copper plating layer is formed on the plated thin copper layer followed by this step. But, in the manufacturing method of the present invention, the electrolytic copper plating for inter layer connection can be performed at the same time of an electrolytic copper plating to form inner circuits in the later Step D, so it allows less process steps.

In Step C, as shown in FIG. 10 (d), a plating resist layer 23 is formed on the surface of the double-sided copper-clad laminate for inner layer in which thin copper plating has been finished. And then the circuit pattern is exposed on the plating resist layer and developed such that a portion of the plating resist layer where the circuit formation is not performed remains as shown in FIG. 10 (d) The thickness of the plating resist layer 23 is made to be nearly equal to that of conductors to be formed by electrolytic copper plating as described later. As plating resist mentioned herein, the so-called liquid resist or dry film is recommended.

In Step D, copper is deposited on the portion where the plating resist layer is not formed to finish an interlayer connection layer 24 and a temporary inner circuit pattern 25 as shown in FIG. 10 (e) by electrolytic copper plating. Then the plating resist layer is removed and the copper foil layer of the double-sided copper-clad laminate for inner layer which is existed at the position under the plating resist layer is etched out to finish an inner layer circuit pattern and obtain an inner layer circuit board as shown in FIG. 11 (f). For this electrolytic copper plating, a copper sulfate bath conventionally used in printed wiring boards' process is usable. The thickness of this plating may be suitably selected according to the applications, and is not especially limited. An etching solution for etching the copper foil layer of the double-sided copper-clad laminate for inner layer which is exist at the position under the plating resist layer is not also especially limited.

In Step E, on both surfaces and one surface of the inner layer circuit board, a resin layer of the electrodeposited copper foil with carrier foil provided with the resin layer of the present invention is lied on. Then they are laminated by hot-press as shown in FIG. 11 (g). After that the carrier foil is removed to obtain a multilayer copper-clad laminate 26 having three or more conductor layers as shown in FIG. 11 (h). Now, by use of the electrodeposited copper foil with carrier foil, even if the electrodeposited copper foil layer is thin, the presence of the carrier foil makes the pressure at the pressing process uniform, and it makes the resin easily flow into the through holes of the inner layer board.

[A Manufacturing Method of a Multilayer Printed Wiring Board]

It is possible to obtain a multilayer printed wiring board as followings. An outer layer copper foil of the multilayer copper-clad laminate obtained as described above are subjected to a ablation process of blind via holes, etc. according to the conventional methods with desmearing treatment optionally, plating for interlayer conduction, etc., and then finish outer layer circuits to obtain a multilayer printed wiring board.

However, the process steps A to D described above can be applied to the outer layer circuit formation also. Plating on the outer circuits and the inner wall of the ablated blind via holes for interlayer connection can be finished in same time, and it allows less process steps. Specifically, the outer circuit formation is performed through the following steps to obtain a multilayer printed wiring board.

Step 1: An outer layer part of the multilayer copper-clad laminate is subjected to an ablation-process to form blind via holes, etc., optionally followed by a residue removal treatment such as desmearing treatment.

Step 2: Thin copper is plated in the inner wall of the ablation-processed part to form blind via holes, etc. to perform an interlayer connection.

Step 3: A plating resist layer is formed on the outer layer copper foil surface of the multilayer copper-clad laminate obtained in step 2; and a plating resist pattern is exposed on the plating resist layer and developed to form the plating resist layer on a portion where the circuit formation is not performed.

Step 4: Copper is deposited by electrolytic copper plating on a portion where the plating resist layer is not formed to form an outer layer circuit pattern. After that, the plating resist layer is removed and the outer layer copper foil layer of the multilayer copper-clad laminate which is existed on the position under the plating resist layer is etched out to form an outer layer circuit, thus a multilayer printed wiring board is obtained.

These steps are as shown in FIG. 12 and FIG. 13, and since they are similar to the process of the above described steps A to D, their description here will be omitted to avoid the duplicate description. By repeating the concept described above, manufacture of a multilayer printed wiring board with four or more layers can be produced according to the order. So, it is clearly understood that the scope of the present invention is not interpreted as being limited to a four-layered multilayer printed wiring board shown in the drawing.

Advantages of the Invention

The electrodeposited copper foil with carrier foil on which a resin layer is formed of the present invention, even if the electrodeposited copper foil layer has not been subjected to a roughening treatment, shows an excellent adhesion with a base resin and sufficiently applicable peel strength. And applying of the electrodeposited copper foil with carrier foil enables remarkable thinning of the thickness of the electrodeposited copper foil layer. So, occurrence of wrinkles and breakage at handling of the foil can be eliminated, and also the surface contaminating of the electrodeposited copper foil layer in the process to form a resin layer can be eliminated. Moreover, it eases the resin flow into through holes, etc. in the lamination step to finish a multilayer printed wiring board and it improves product quality. Consequently, the product quality by the manufacturing process of the multilayer copper-clad laminate and multilayer printed wiring board of the present invention is remarkably improved.

Figure 1:
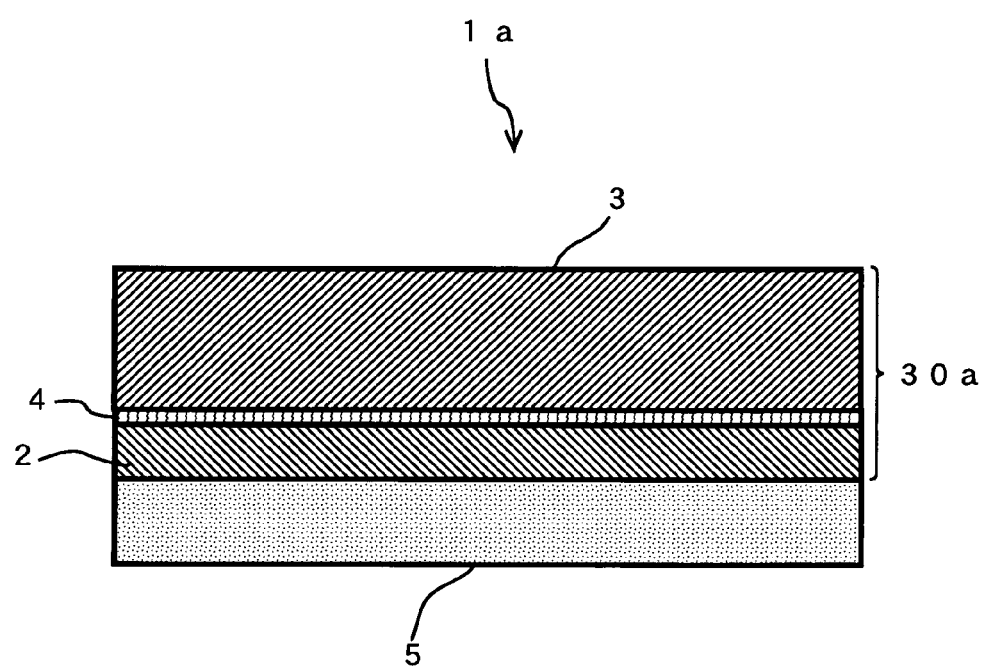
FIG. 1 is a schematic sectional view of an electrodeposited copper foil with carrier foil on which a resin layer is formed of the present invention.
Figure 2:
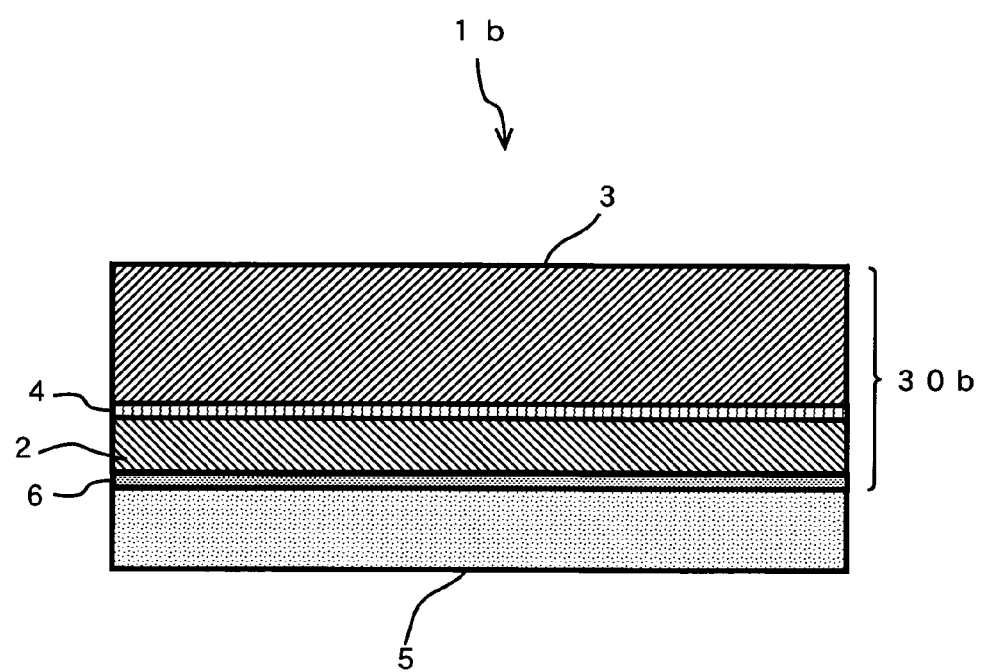
FIG. 2 is a schematic sectional view of an electrodeposited copper foil with carrier foil on which a resin layer is formed of the present invention.
Figure 3:
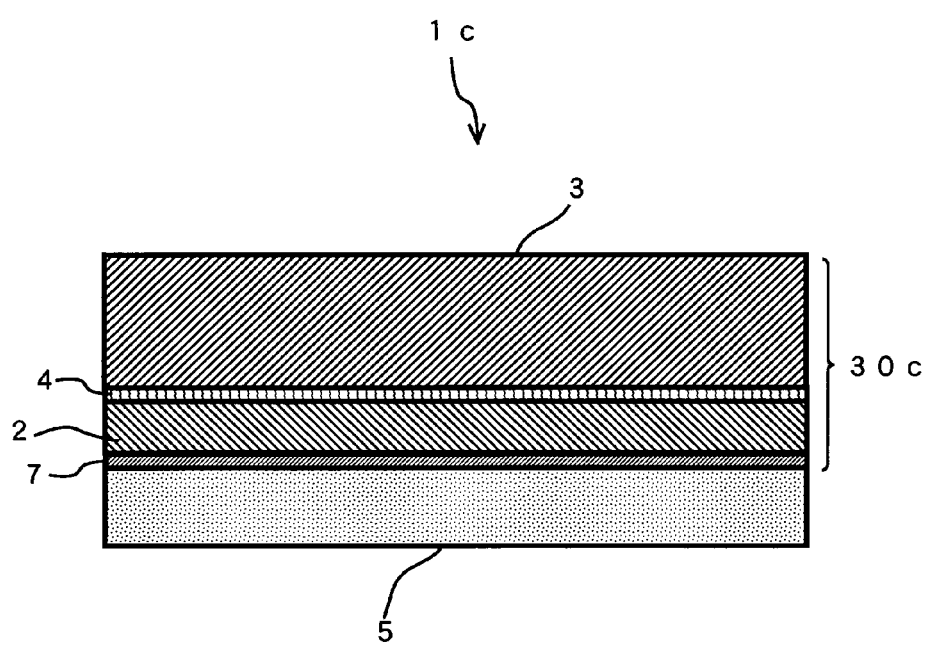
FIG. 3 is a schematic sectional view of an electrodeposited copper foil with carrier foil on which a resin layer is formed of the present invention.
Figure 4:
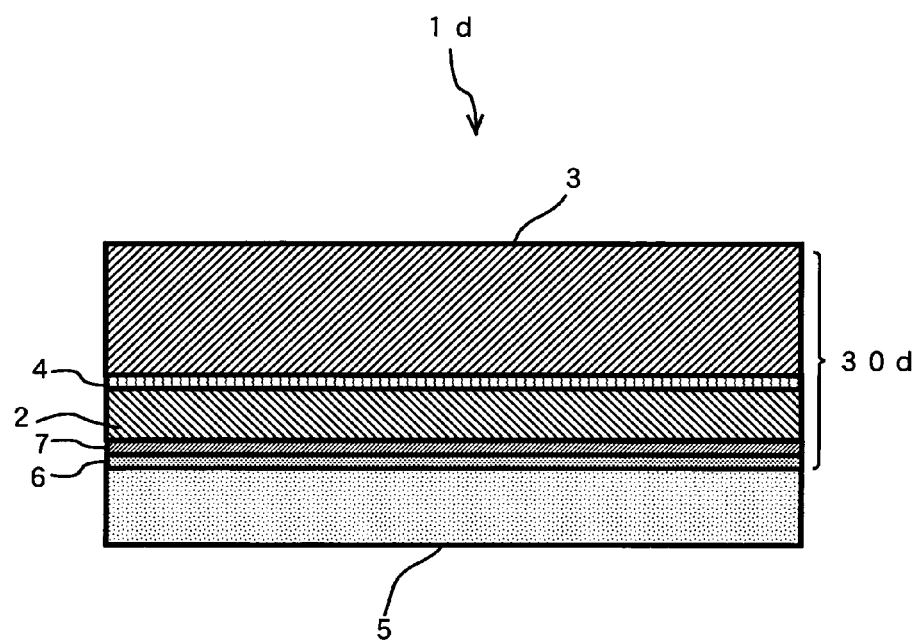
FIG. 4 is a schematic sectional view of an electrodeposited copper foil with carrier foil on which a resin layer is formed of the present invention.
Figure 5:
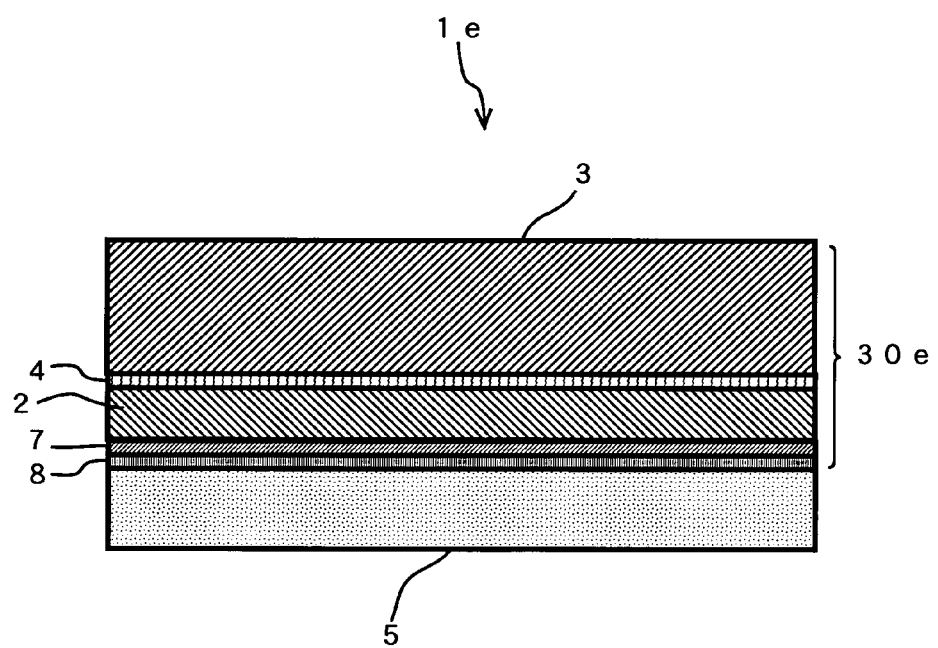
FIG. 5 is a schematic sectional view of an electrodeposited copper foil with carrier foil on which a resin layer is formed of the present invention.
Figure 6:
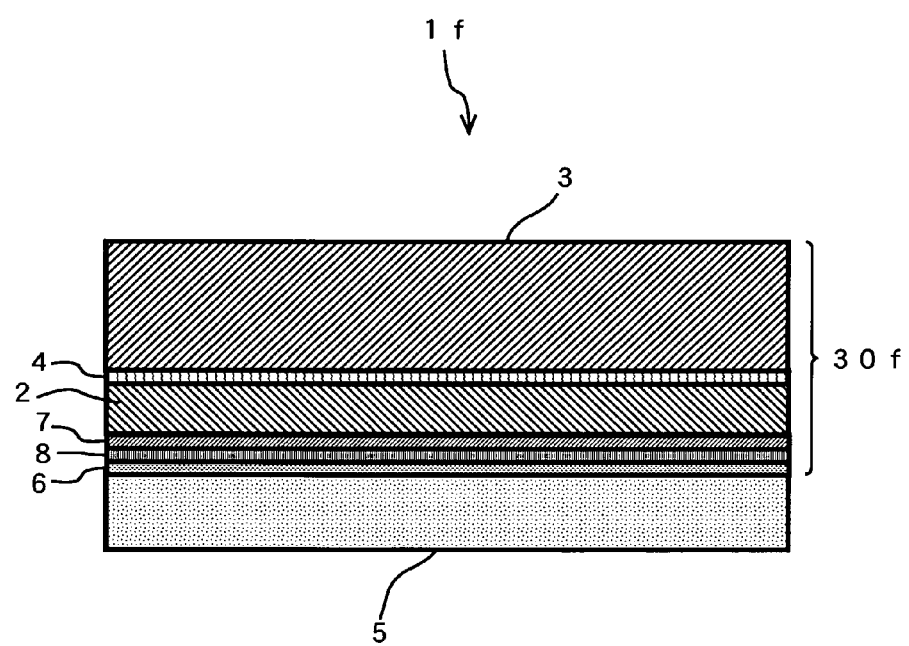
FIG. 6 is a schematic sectional view of an electrodeposited copper foil with carrier foil on which a resin layer is formed of the present invention.
Figure 7:
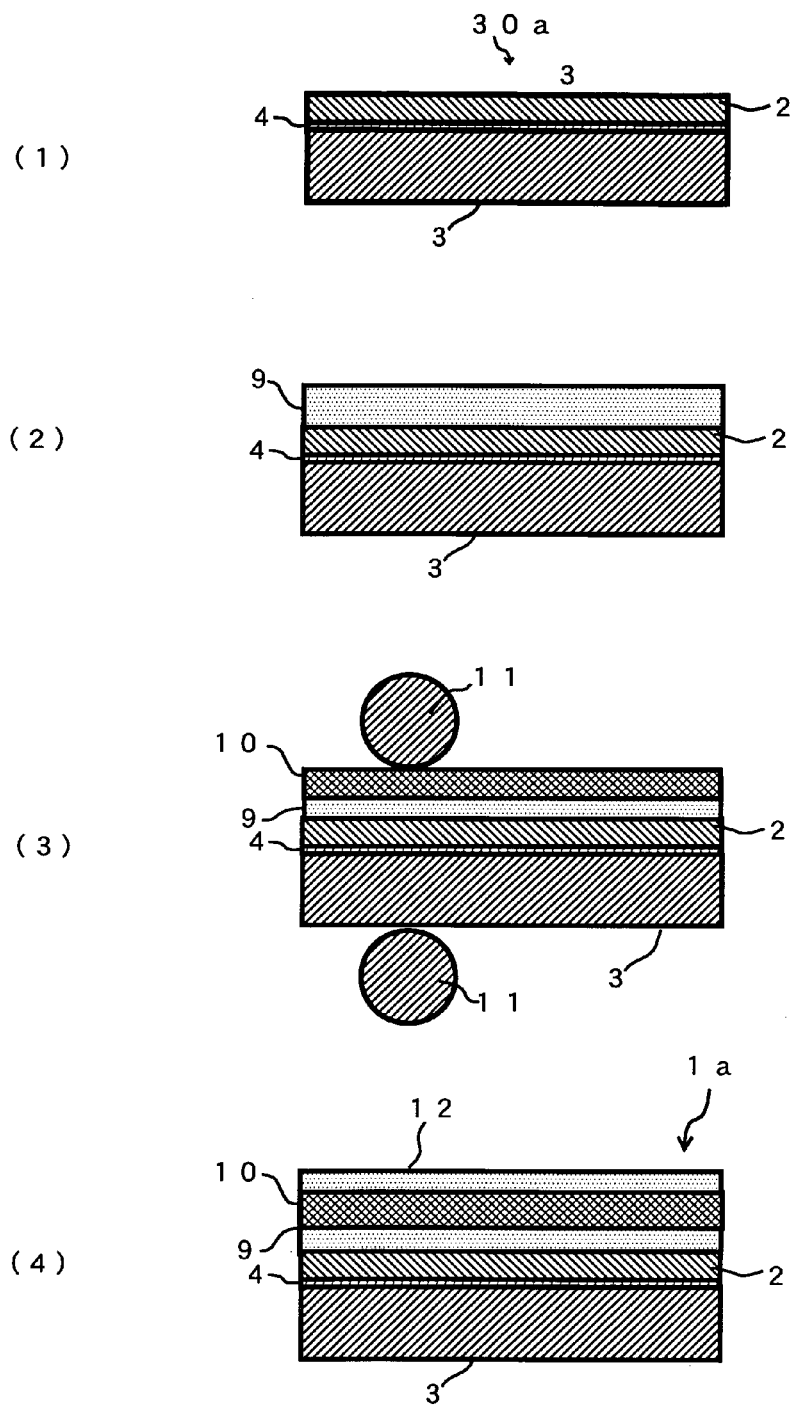
FIG. 7 is a process flow in the case in which a resin layer contains a skeletal material.
Figure 8:
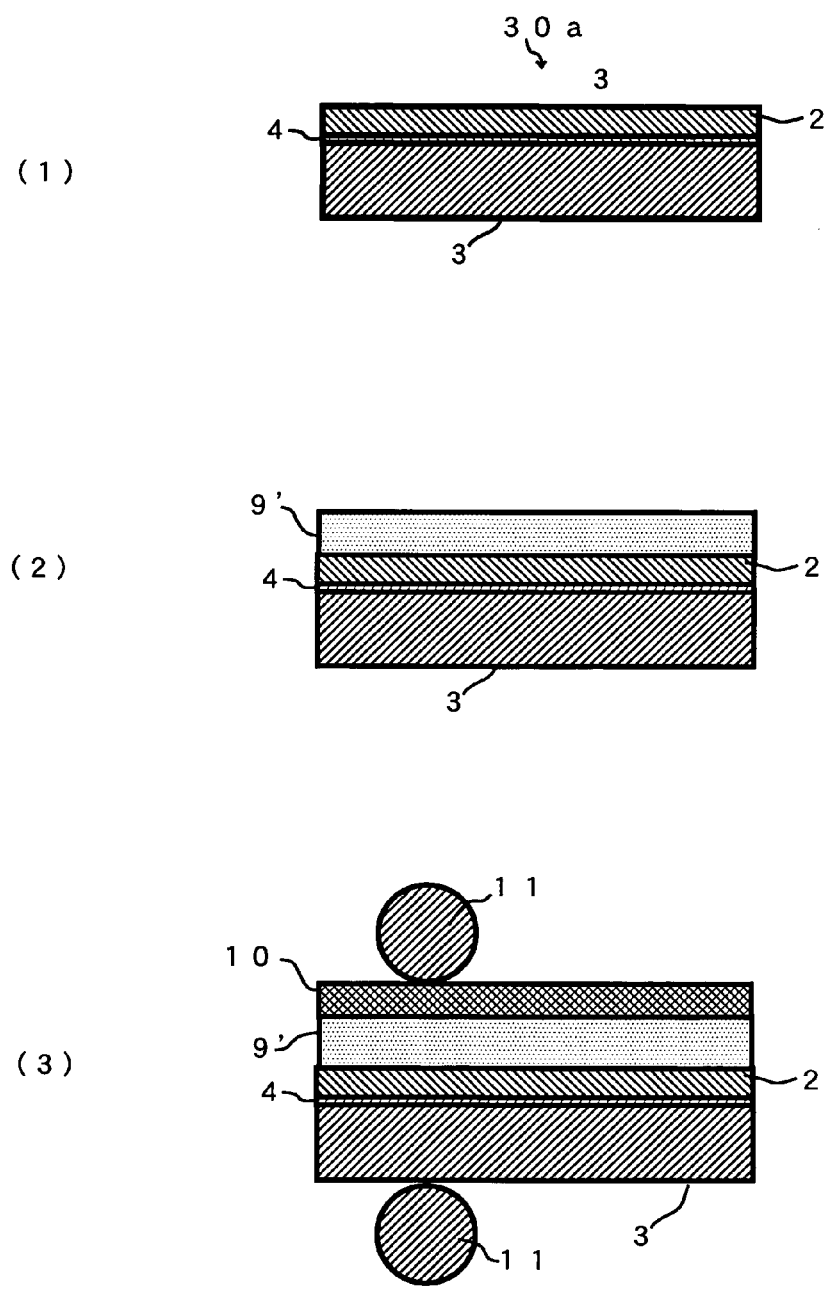
FIG. 8 is a process flow in the case in which a resin layer contains a skeletal material.
Figure 9:
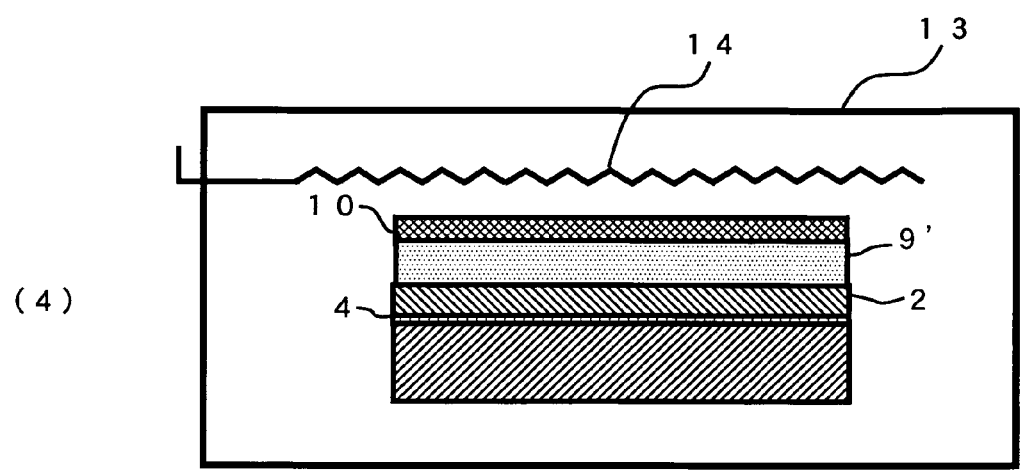
FIG. 9 is a process flow in the case in which a resin layer contains a skeletal material.
Figure 9:
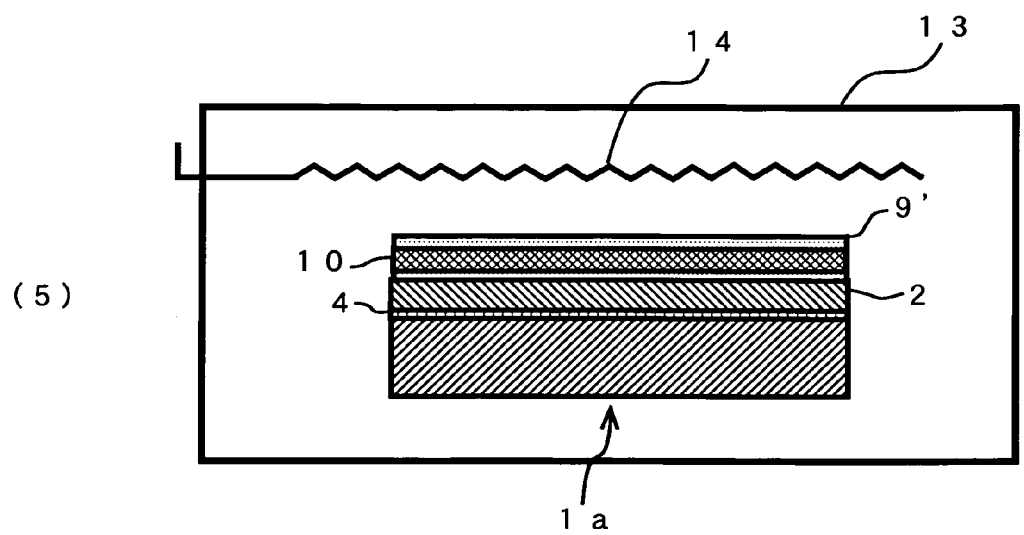

DESCRIPTION OF SYMBOLS 1a to 1f electrodeposited copper foil with carrier foil on which a resin layer is formed
2 electrodeposited copper foil layer
3 carrier foil layer
4 bonding interface layer
5 resin layer
6 silane coupling agent layer
7 rustproofing layer of metal
8 chromate layer
9 first thermosetting resin layer
10 skeletal material (non-woven paper or woven cloth)
11 press rolls for lamination
12 second thermosetting resin layer
13 heating furnace
14 heater
20 double-sided copper-clad laminate
21 copper foil layer for forming inner layer circuit
22 plated thin copper layer
23 plating resist layer
24 interlayer connection layer
25 inner layer circuit
26 multilayer copper-clad laminate
27 multilayer printed wiring board
30a to 30f electrodeposited copper foil with carrier foil

BEST MODE FOR CARRYING OUT THE INVENTION

Hereinafter, preferred embodiments will be shown through examples and comparative examples. First of all, an electrodeposited copper foil with carrier foil commonly used in examples shown below will be described.

[Preparation of Electrodeposited Copper Foil with Carrier]

Electrodeposited copper foil with carrier foil used in examples below was prepared as follows.

A first electrodeposited copper foil with carrier foil: An electrodeposited copper foil of 18 μm thick was used as a carrier foil 3; and the surface of the carrier foil 3 was subjected to a pickling treatment to completely remove contaminated oil and fat components and remove an excess oxide layer on the surface. The pickling treatment was performed with a dilute sulfuric acid solution of a concentration 100 g/L at a solution temperature of 30° C. and immersion time of 30 seconds.

The carrier foil 3 after pickling treatment was immersed in an aqueous solution containing CBTA of a concentration of 5 g/L at a solution temperature of 40° C. at pH of 5 for 30 seconds to form a bonding interface layer 4 on its surface. Exactly speaking, in the case of using such an immersion method, the bonding interface layers B might be formed on both surfaces of the carrier foil 3, but the bonding interface layer 4 is shown only on one surface.

After the formation of the bonding interface layer 4 was finished, the carrier foil 3 itself on which the bonding interface layer 4 had been formed was cathodically polarized in an electrolyte solution to electrolytically deposit an electrodeposited copper foil layer 2 (a copper layer for forming a conductor circuit of a nominal thickness of 5 μm) on the bonding interface layer 4. The electrolysis was performed using a copper sulfate solution as the electrolyte solution of a copper concentration of 55 g/L and a free sulfuric acid concentration of 70 g/L at a solution temperature of 40° C. and in a current density of 5 $A/dm^2$. Thereafter, the product was rinsed enough with water, and dried to finish an electrodeposited copper foil with carrier foil 30a.

A second electrodeposited copper foil with carrier foil: An electrodeposited copper foil layer was formed through the process similar to that of the first electrodeposited copper foil with carrier foil; and a silane coupling agent layer was formed on the electrodeposited copper foil layer 2 directly. Thereafter, the product was rinsed enough with water, and dried to finish an electrodeposited copper foil with carrier foil 1e. The formation of the silane coupling agent layer was performed by an adsorption treatment by showering a solution containing an de-ionized water as the solvent and γ-aminopropyltrimethoxysilane of a concentration of 5 g/L on the surface of an electrodeposited copper foil layer, and holding the product in a drying furnace in an atmosphere where the foil temperature was kept at 150° C. for 4 seconds to purge the solvent and then promote the condensation reaction of the silane coupling agent. Hereinafter, in the case of performing a silane coupling agent treatment, the similar condition was employed.

A third electrodeposited copper foil with carrier foil: An electrodeposited copper foil layer was formed through the process similar to that of the first electrodeposited copper foil with carrier foil; and a rustproofing layer 7 was formed on the electrodeposited copper foil layer 2 directly. For the rustproofing layer 7, nickel-zinc alloy plating was performed on the surface of the electrodeposited copper foil layer 2. Thereafter, the product was rinsed enough with water, and dried to manufacture an electrodeposited copper foil with carrier foil 30c. The nickel-zinc alloy plating treatment was performed by an electrolysis under the conditions using an electrolytic solution containing nickel sulfate of a nickel concentration of 0.3 g/l, zinc pyrophosphate of a zinc concentration of 2.5 g/l and potassium pyrophosphate of 100 g/l and at a solution temperature of 40° C., to form a zinc-nickel alloy plating layer containing nickel of 71 wt % and zinc of 29 wt %. Hereinafter, in the case of performing zinc-nickel alloy plating, the similar condition was employed.

A fourth electrodeposited copper foil with carrier foil: A rustproofing layer was formed through the process similar to that of the third electrodeposited copper foil with carrier foil. For the rustproofing layer 7, nickel-zinc alloy plating treatment was performed on the surface of the electrodeposited copper foil layer 2, and then a silane coupling agent treatment was performed. Thereafter, the product was rinsed enough with water, and dried to manufacture an electrodeposited copper foil with carrier foil 30d.

A fifth electrodeposited copper foil with carrier foil: An electrodeposited copper foil layer was formed through the process similar to that of the first electrodeposited copper foil with carrier foil; and a rustproofing layer 7 was formed on the electrodeposited copper foil layer 2 by a nickel-zinc alloy plating treatment and a chromate treatment. Thereafter, the product was rinsed enough with water, and dried to manufacture an electrodeposited copper foil with carrier foil 30e. The chromate treatment forming a chromate layer on the nickel-zinc alloy plating layer is performed by electrolysis. The electrolysis condition was chromic acid of 1.0 g/l, a solution temperature of 35° C., and a current density of 8 $A/dm^2$ and an electrolysis time of 5 seconds. Hereinafter, in the case of forming a chromate layer, the similar condition was employed.

A sixth electrodeposited copper foil with carrier foil: An electrodeposited copper foil layer was formed through the process similar to that of the first electrodeposited copper foil with carrier foil; a rustproofing layer 7 was formed directly on the electrodeposited copper foil layer 2 by a nickel-zinc alloy plating treatment and a chromate treatment; and a silane coupling agent treatment was performed on the chromate layer. Thereafter, the product was rinsed enough with water, and dried to manufacture an electrodeposited copper foil with carrier foil 30f.

[Preparation of Resin Compositions]

A resin composition 1: A resin formulation containing 38 parts by weight of o-cresol novolac epoxy resin (YDCN-704, manufactured by Tohto Kasei Co., Ltd.) and 50 parts by weight of a solvent-soluble aromatic polyamide resin polymer BP3225-50P, manufactured by Nippon Kayaku Co., Ltd., which is commercially available as a mixed varnish with cyclopentanone as the solvent, were used. In addition, 18 parts by weight of a phenol resin VH-4170, manufactured by Dainippon Ink and Chemicals, Inc. as the curing agent and 0.1 parts by weight of 2E4MZ, manufactured by Shikoku Chemicals Corp. as the curing accelerator were blended with methyl ethyl ketone to adjust a resin content 30 wt % in a resin composition.

A resin composition 2: A resin formulation containing 30 wt % of a bisphenol-A epoxy resin (trade name: Epikote 828EL, manufactured by Japan Epoxy Resins Co., Ltd.), 30 wt % of a cresol novolac epoxy resin (trade name: Epiclon N-673, manufactured by Dainippon Ink and Chemicals, Inc.) and 30 wt % of a bromated bisphenol-A epoxy resin (trade name: YDB-500, Tohto Kasei Co., Ltd.) were heated and dissolved at 80° C. in methyl ethyl ketone with agitation. Then 4 wt % addition of 2,4-diamino-6-(2-methyl-1-imidazolylethyl)-1,3,5-triazine isocyanuric acid as a latent epoxy curing agent, 2 wt % addition of a finely pulverized silica and 4 wt % addition of antimony trioxide were blended to make an epoxy-based resin composition.

A resin composition 3: A resin formulation containing 20 wt % of a poly-phenylene ether resin (trade name: PKN4752, manufactured by Nippon GE plastics Co., Ltd.), 40 wt % of 2,2-bis(4-cyanatophenyl)propane (trade name: ArocyB-10, manufactured by Asahi-Ciba Ltd.), 8 wt % of a phosphorus-containing phenol compound (trade name: HCA-HQ, manufactured by Sanko Chemical Co., Ltd.), 0.1 wt % of manganese naphthenate (manganese content=6 parts by weight, manufactured by Nihon Kagaku Sangyo Co., Ltd.) and 32 wt % of 2,2-bis(4-glycidylphenyl)propane (trade name: DER331L, manufactured by Dow Chemical Japan Ltd.) were heated and dissolved at 80° C. in toluene to make a polyphenylene ether cyanate-based resin composition.

A resin composition 4: A resin formulation containing 80 wt % of a siloxane-modified polyamideimide resin (trade name: KS-6600, manufactured by Hitachi Chemical Co., Ltd.) and 20 wt % of a cresol novolac epoxy resin (trade name: YDCN-703, manufactured by Tohto Kasei Co., Ltd.) were dissolved at 80° C. in NMP (N-methylpyrrolidone) to make a siloxane-modified polyamideimide-based resin composition.

[Preparation of a Resin Coated Copper Foil with a Carrier Foil (Forming a Resin Layer)]

In the case that resin layer is formed of just the resin composition: Any one of above mentioned resin composition was coated on the electrodeposited copper foil layer of the electrodeposited copper foil with carrier foil by roll coater and then dried to get 50 μm thick resin layer in a Semi-cured state.

In the case that resin layer is formed of the resin composition which contains dielectric filler: Resin composition described below was prepared by blending any one of above mentioned resin composition with barium titanate powder as the dielectric filler having powder properties shown below.

Powder properties of the dielectric filler are that average particle diameter ($D_{IA}$) was 0.25 μm, median particle diameter in volume ($D_{50}$) was 0.5 μm and aggregation rate ($D_{50}/D_{IA}$) was 2.0. Then 83.3 parts by weight of resin composition and 100 parts by weight of the dielectric filler was fully mixed in kneader to be the dielectric filler containing resin composition.

Resin composition prepared above was coated on the electrodeposited copper foil layer by using an edge coater to form resin layer containing the dielectric filler having 50 μm thick and dried in air for 5 min. followed by heating at 140 deg. C. for 3 min. and then resin containing the dielectric filler layer with 50 μm thick in semi-cured state was formed.

In the case of forming a resin layer containing skeletal material: Any one of above mentioned resin composition was coated on the electrodeposited copper foil layer 2 of the electrodeposited copper foil with carrier by roll coater and it was kept in room temperature for 30 min. followed by heating with hot air at 150 deg. C. for 2 min. to dry and then 50 μm thick resin layer in semi-cured state was obtained.

Next step was a lamination of unwoven paper 10 of nominal thickness 45 μm made of aramid fiber on the coated thermo-setting resin layer in semi-cured state. The lamination was performed slowly as following. Unwoven paper laminated thermo-setting resin layer was heated up to 100 deg. C. and passed through the heating rolls 11 which can apply lamination pressure 5 kgf/cm², with the line speed of 50 cm/min. After that, the total thickness of the unwoven paper 10 with the thermosetting resin layer was 60 μm; and no resin was penetrated from the surface of the unwoven paper 10 and there was no contamination on the heating rolls.

After finishing the lamination of unwoven paper to the thermosetting resin layer 9', it was re-fluidized by keeping in the condition 150 deg. C. for 1 min., and then resin composition is impregnated into unwoven paper through capillary phenomenon. As a result, unwoven paper was fully covered with the resin. At this time, the total thickness of the thermo-setting resin layer with unwoven paper after curing was 50 μm.

Example 1

First electrodeposited copper foil with carrier foil produced as described above was coated with each resin composition and resin coated electrodeposited copper foils with carrier foil were produced.

To examine adhesion property to the base resin, above mentioned resin coated electrodeposited copper foil with carrier foil was laminated with FR-4 base material and then carrier foil was released, followed by copper plating up to 18 μm. Then linear traces which have width of 0.8 mm and 0.2 mm were formed on the copper clad laminate for measuring of peel strength. Results are shown in Table 1.

Figure 10:
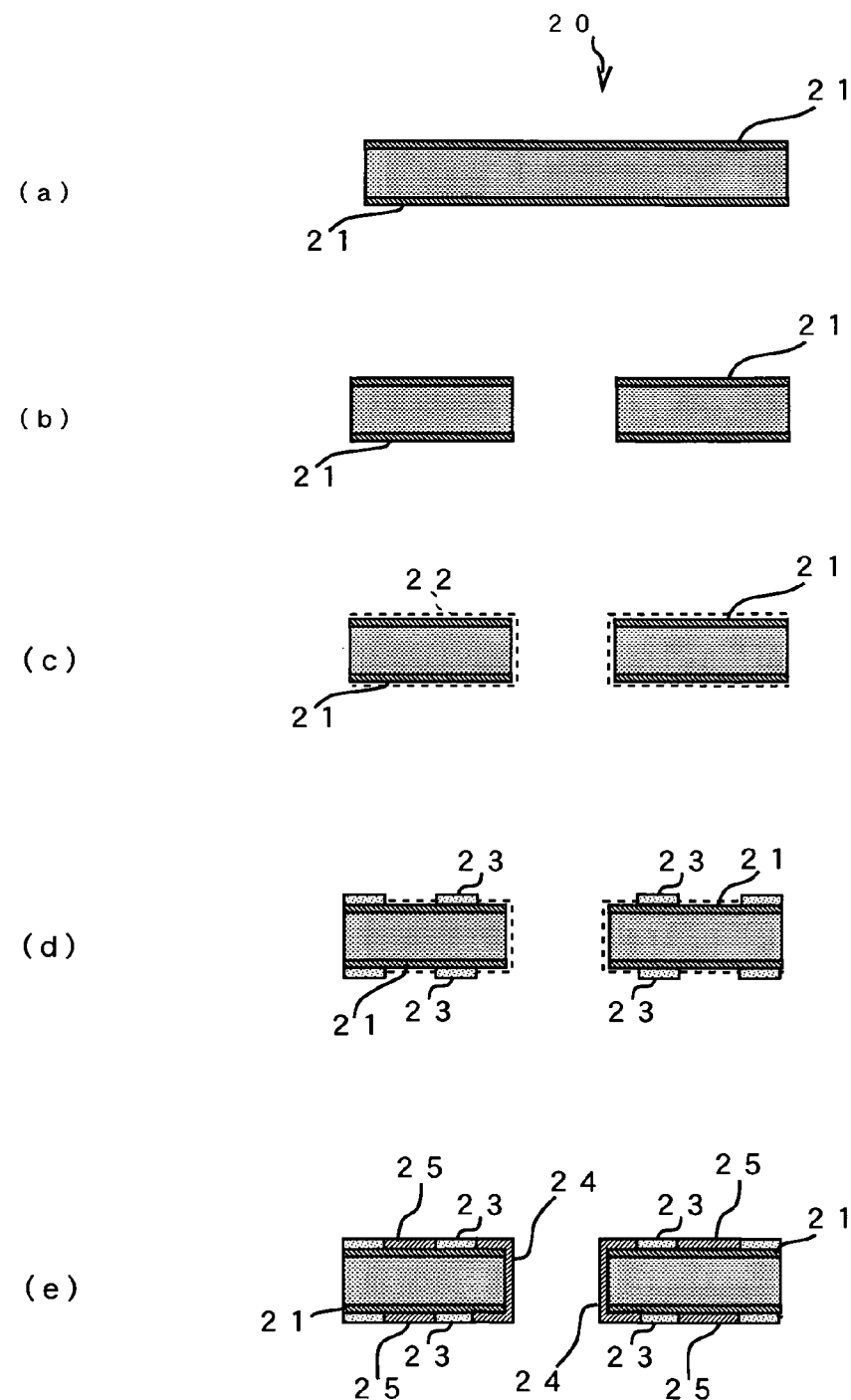
FIG. 10 is a process flow of manufacturing a multilayer copper-clad laminate.
Figure 11:
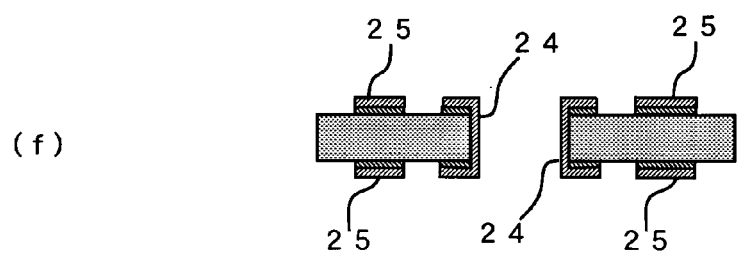
FIG. 11 is a process flow of manufacturing a multilayer copper-clad laminate.
Figure 11:
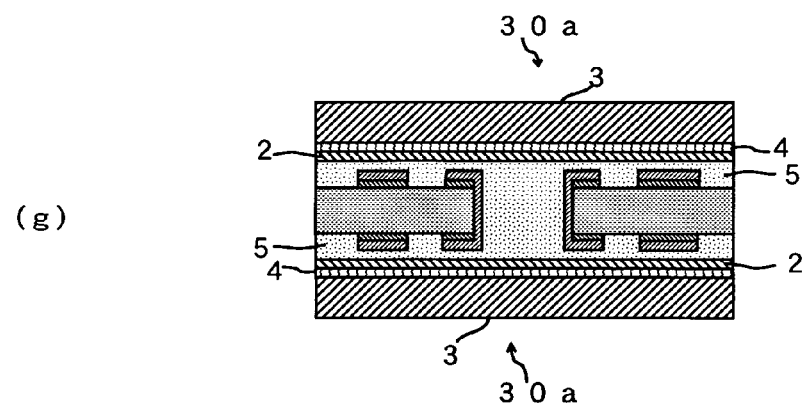
Figure 11:
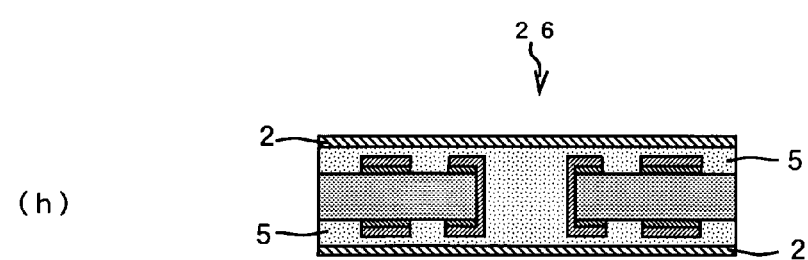
Figure 12:
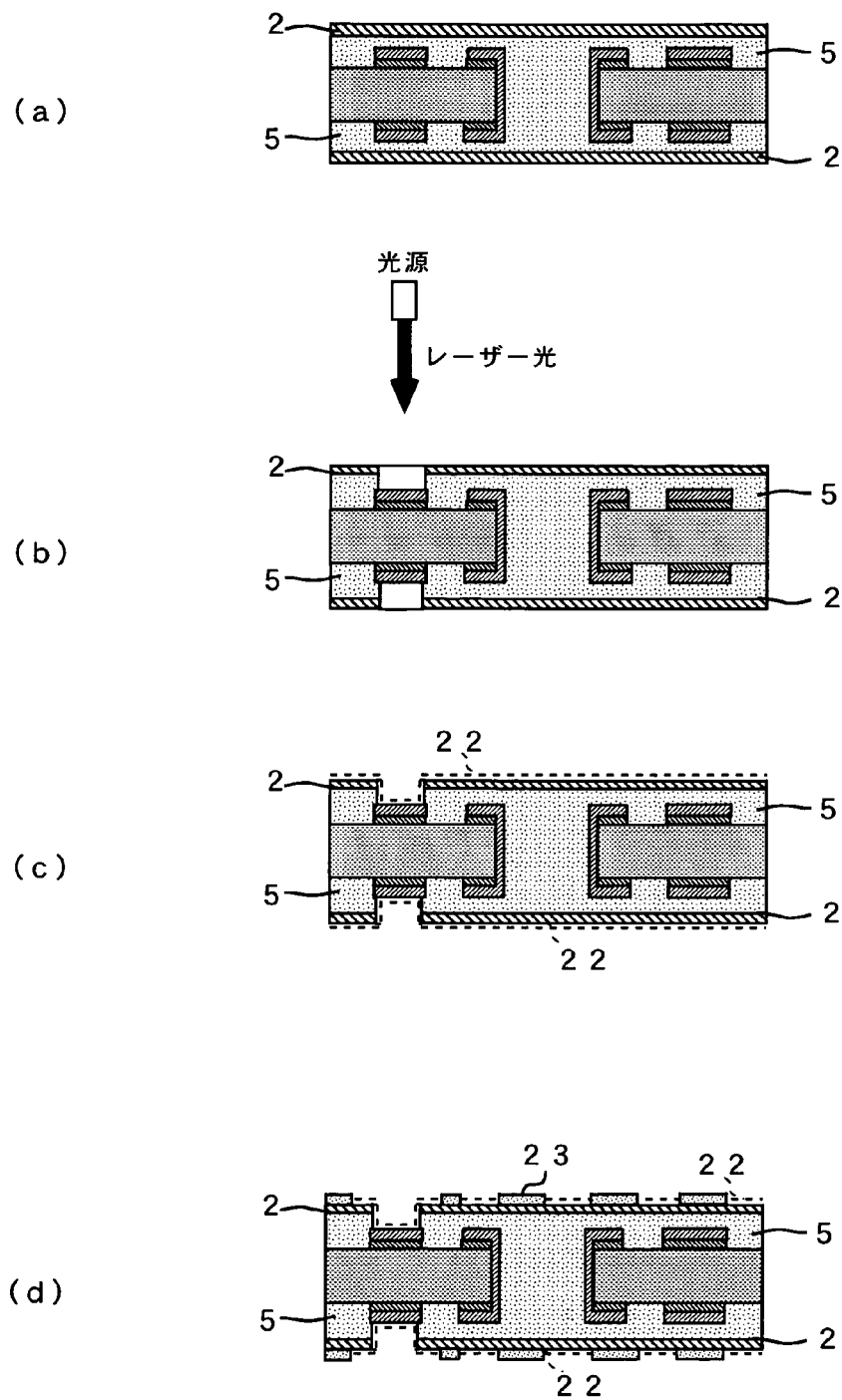
FIG. 12 is a process flow of manufacturing a multilayer printed wiring board by processing a multilayer copper-clad laminate.
Figure 13:
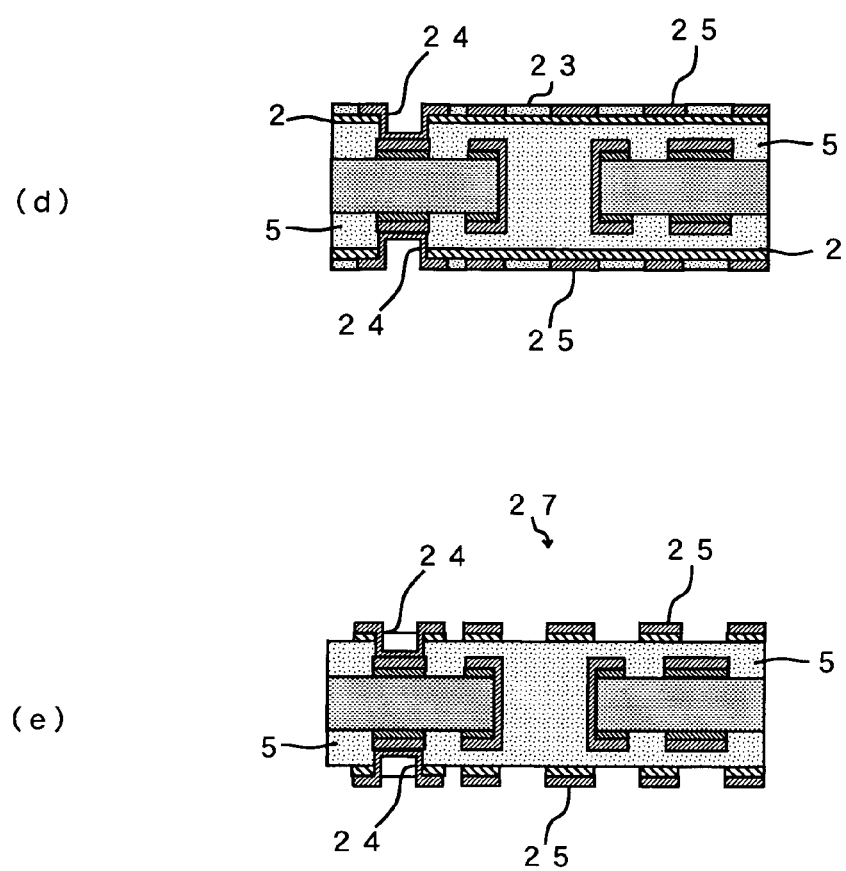
FIG. 13 is a process flow of manufacturing a multilayer printed wiring board by processing a multilayer copper-clad laminate.

In addition, double-sided copper clad laminate with 12 micron electrodeposited copper foil was prepared to form inner layer board. Four-layered copper clad laminate was produced in procedure shown in FIG. 10 to FIG. 11 and then 4 layer printed wiring board was produced. The four-layered printed wiring board show good performance.

TABLE 1

| Using resin | Resin layer constitution | Peel strength (unit: kgf/cm) | |
|---|---|---|---|
| | | 0.8 mm circuit | 0.2 mm circuit |
| Resin composition 1 | Resin alone | 0.38 | 0.56 |
| | Filler containing | 0.23 | 0.29 |
| | Skeletal material-containing | 0.39 | 0.54 |
| Resin composition 2 | Resin alone | 0.30 | 0.28 |
| | Filler containing | 0.22 | 0.39 |
| | Skeletal material-containing | 0.35 | 0.37 |
| Resin composition 3 | Resin alone | 0.18 | 0.17 |
| | Filler containing | 0.13 | 0.31 |
| | Skeletal material-containing | 0.26 | 0.26 |
| Resin composition 4 | Resin alone | 0.20 | 0.12 |
| | Filler containing | 0.09 | 0.27 |
| | Skeletal material-containing | 0.19 | 0.14 |

Example 2

Second electrodeposited copper foil with carrier foil produced as described above was coated with each resin composition and resin coated electrodeposited copper foils with carrier foil were produced.

To examine adhesion property to the base resin, as similar with Example 1, linear traces having width of 0.8 mm and 0.2 mm were formed on the copper clad laminate for measuring peel strength. Results are shown in Table 2. In addition, using double-sided copper clad laminate with 12 micron electrodeposited copper foil was prepared to form inner layer board, four-layered copper clad laminate was produced and then 4 layer printed wiring board was produced as similar with Example 1. The four-layered printed wiring board show good performance.

TABLE 2

| Using resin | Resin layer constitution | Peel strength (unit: kgf/cm) | |
|---|---|---|---|
| | | 0.8 mm circuit | 0.2 mm circuit |
| Resin composition 1 | Resin alone | 0.43 | 0.51 |
| | Filler containing | 0.41 | 0.55 |
| | Skeletal material containing | 0.46 | 0.59 |

TABLE 2-continued

| Using resin | Resin layer constitution | Peel strength (unit: kgf/cm) | |
|---|---|---|---|
| | | 0.8 mm circuit | 0.2 mm circuit |
| Resin composition 2 | Resin alone | 0.63 | 0.54 |
| | Filler containing | 0.51 | 0.70 |
| | Skeletal material containing | 0.62 | 0.58 |
| Resin composition 3 | Resin alone | 0.65 | 0.80 |
| | Filler containing | 0.57 | 0.66 |
| | Skeletal material containing | 0.72 | 0.82 |
| Resin composition 4 | Resin alone | 0.50 | 0.70 |
| | Filler containing | 0.38 | 0.54 |
| | Skeletal material containing | 0.52 | 0.64 |

Example 3

Third electrodeposited copper foil with carrier foil produced as described above was coated with each resin composition and resin coated electrodeposited copper foils with carrier foil were produced.

To examine adhesion property to the base resin, as similar with Example 1, linear traces having width of 0.8 mm and 0.2 mm were formed on the copper clad laminate for measuring peel strength. Results are shown in Table 3. In addition, using double-sided copper clad laminate with 12 micron electrodeposited copper foil was prepared to form inner layer board, four-layered copper clad laminate was produced and then 4 layer printed wiring board was produced as similar with Example 1. The four-layered printed wiring board show good performance.

TABLE 3

| Using resin | Resin layer constitution | Peel strength (unit: kgf/cm) | |
|---|---|---|---|
| | | 0.8 mm circuit | 0.2 mm circuit |
| Resin composition 1 | Resin alone | 0.78 | 0.82 |
| | Filler containing | 0.63 | 0.74 |
| | Skeletal material containing | 0.75 | 0.78 |
| Resin composition 2 | Resin alone | 0.56 | 0.63 |
| | Filler containing | 0.51 | 0.44 |
| | Skeletal material containing | 0.53 | 0.66 |
| Resin composition 3 | Resin alone | 0.48 | 0.56 |
| | Filler containing | 0.30 | 0.29 |
| | Skeletal material containing | 0.57 | 0.75 |
| Resin composition 4 | Resin alone | 0.63 | 0.81 |
| | Filler containing | 0.53 | 0.70 |
| | Skeletal material containing | 0.60 | 0.64 |

Example 4

Forth electrodeposited copper foil with carrier foil produced as described above was coated with each resin composition and resin coated electrodeposited copper foils with carrier foil were produced.

To examine adhesion property to the base resin, as similar with Example 1, linear traces having width of 0.8 mm and 0.2 mm were formed on the copper clad laminate for measuring peel strength. Results are shown in Table 4. In addition, using double-sided copper clad laminate with 12 micron electrodeposited copper foil was prepared to form inner layer board, four-layered copper clad laminate was produced and then 4 layer printed wiring board was produced as similar with Example 1. The four-layered printed wiring board show good performance.

TABLE 4

| Using resin | Resin layer constitution | Peel strength (unit: kgf/cm) | |
|---|---|---|---|
| | | 0.8 mm circuit | 0.2 mm circuit |
| Resin composition 1 | Resin alone | 1.01 | 1.18 |
| | Filler containing | 1.01 | 1.04 |
| | Skeletal material containing | 1.08 | 1.05 |
| Resin composition 2 | Resin alone | 0.81 | 0.91 |
| | Filler containing | 0.80 | 0.70 |
| | Skeletal material containing | 0.84 | 0.92 |
| Resin composition 3 | Resin alone | 1.22 | 1.40 |
| | Filler containing | 1.11 | 1.22 |
| | Skeletal material containing | 1.13 | 1.19 |
| Resin composition 4 | Resin alone | 0.75 | 0.68 |
| | Filler containing | 0.73 | 0.90 |
| | Skeletal material containing | 0.83 | 0.74 |

Example 5

Fifth electrodeposited copper foil with carrier foil produced as described above was coated with each resin composition and resin coated electrodeposited copper foils with carrier foil were produced.

To examine adhesion property to the base resin, as similar with Example 1, linear traces having width of 0.8 mm and 0.2 mm were formed on the copper clad laminate for measuring peel strength. Results are shown in Table 5. In addition, using double-sided copper clad laminate with 12 micron electrodeposited copper foil was prepared to form inner layer board, four-layered copper clad laminate was produced and then 4 layer printed wiring board was produced as similar with Example 1. The four-layered printed wiring board show good performance.

TABLE 5

| Using resin | Resin layer constitution | Peel strength (unit: kgf/cm) | |
|---|---|---|---|
| | | 0.8 mm circuit | 0.2 mm circuit |
| Resin composition 1 | Resin alone | 1.18 | 1.25 |
| | Filler containing | 1.18 | 1.11 |
| | Skeletal material containing | 1.26 | 1.22 |
| Resin composition 2 | Resin alone | 0.79 | 0.87 |
| | Filler containing | 0.72 | 0.76 |
| | Skeletal material containing | 0.88 | 1.05 |
| Resin composition 3 | Resin alone | 1.35 | 1.37 |
| | Filler containing | 1.25 | 1.21 |
| | Skeletal material containing | 1.33 | 1.47 |
| Resin composition 4 | Resin alone | 0.72 | 0.87 |
| | Filler containing | 0.62 | 0.59 |
| | Skeletal material containing | 0.65 | 0.71 |

Example 6

Sixth electrodeposited copper foil with carrier foil produced as described above was coated with each resin composition and resin coated electrodeposited copper foils with carrier foil were produced.

To examine adhesion property to the base resin, as similar with Example 1, linear traces having width of 0.8 mm and 0.2 mm were formed on the copper clad laminate for measuring peel strength. Results are shown in Table 6. In addition, using double-sided copper clad laminate with 12 micron electrodeposited copper foil was prepared to form inner layer board, four-layered copper clad laminate was produced and then 4 layer printed wiring board was produced as similar with Example 1. The four-layered printed wiring board show good performance.

TABLE 6

| Using resin | Resin layer constitution | Peel strength (unit: kgf/cm) | |
|---|---|---|---|
| | | 0.8 mm circuit | 0.2 mm circuit |
| Resin composition 1 | Resin alone | 1.62 | 1.57 |
| | Filler containing | 1.48 | 1.62 |
| | Skeletal material containing | 1.55 | 1.47 |
| Resin composition 2 | Resin alone | 0.99 | 1.01 |
| | Filler containing | 0.94 | 1.13 |
| | Skeletal material containing | 0.96 | 0.98 |
| Resin composition 3 | Resin alone | 1.51 | 1.41 |
| | Filler containing | 1.33 | 1.48 |
| | Skeletal material containing | 1.43 | 1.50 |
| Resin composition 4 | Resin alone | 0.96 | 1.14 |
| | Filler containing | 0.94 | 0.91 |
| | Skeletal material containing | 0.91 | 0.98 |

INDUSTRIAL APPLICABILITY

The electrodeposited copper foil with carrier foil used in the electrodeposited copper foil with carrier foil on which a resin layer for forming insulating layer is formed of the present invention can be provided with an electrodeposited copper foil without roughening treatment. So, process steps can be less and it may lower the manufacturing cost of the electrodeposited copper foil with carrier foil. Moreover, a special apparatus is not required for forming a resin layer onto an electrodeposited copper foil with carrier foil in the production of the electrodeposited copper foil with carrier foil coated with a resin layer for forming insulating layer. Therefore, it enables to be supplied as an inexpensive product in the market. In addition, even if the roughening treatment of the electrodeposited copper foil layer is eliminated, a enough adhesion with a base resin can be so assured as to overthrow practical sense in the conventional printed wiring board industry; and also in a process of circuit etching, consideration on over etching time can be eliminated, thus processing cost may be remarkably reduced.

The invention claimed is:

1. An electrodeposited copper foil with carrier foil comprising:
   a carrier foil;
   a bonding interface layer formed on top of the carrier foil;
   an electrodeposited copper foil layer formed on top of the bonding interface layer having a surface roughness (Rzjis) on both sides of less than 2 μm;
   a rust proofing layer comprising a nickel-zinc alloy formed on top of the electrodeposited copper foil layer, the nickel-zinc alloy having 60 to 80 wt % of Ni and 20 to 40 wt % of Zn; and
   an insulating resin layer formed on top of the rust proofing layer,
   wherein the insulating resin layer comprises:
   a) 20 to 80 parts by weight of an epoxy resin including a curing agent;
   b) 20 to 80 parts by weight of a solvent soluble aromatic polyamide resin polymer; and
   c) optionally a curing accelerator.

2. The electrodeposited copper foil with carrier foil according to claim 1, wherein the aromatic polyamide resin polymer is obtained by a chemical reaction between an aromatic polyamide resin and a rubbery resin.

3. The electrodeposited copper foil with carrier foil according to claim 1, wherein the insulating resin layer comprises a filler composed of a dielectric material.

4. The electrodeposited copper foil with carrier foil according to claim 1, wherein the insulating resin layer comprises a skeletal material.

5. The electrodeposited copper foil with carrier foil according to claim 1, wherein the rustproofing layer additionally comprises a chromate layer.

6. The electrodeposited copper foil with carrier foil according to claim 1, comprising a silane coupling agent layer between the electrodeposited copper foil layer and the insulating resin layer.

7. The electrodeposited copper foil with carrier foil according to claim 6, wherein the silane coupling agent layer is formed by using an amino-functional silane coupling agent or a mercapto-functional silane coupling agent.

8. The electrodeposited copper foil with carrier foil according to claim 1, wherein a thickness of the electrodeposited copper foil layer is 0.5 μm to 12 μm.

9. A copper clad laminate comprising the electrodeposited copper foil with carrier foil according to claim 1.

10. A printed wiring board comprising the electrodeposited copper foil with carrier foil according to claim 1.

* * * * *